US007454182B2

(12) United States Patent  
Inamori et al.

(10) Patent No.: US 7,454,182 B2  
(45) Date of Patent: Nov. 18, 2008

(54) ATTENUATOR WITH SWITCH FUNCTION AND MOBILE TELEPHONE TERMINAL DEVICE USING THE SAME

(75) Inventors: Masahiko Inamori, Ibaraki (JP); Takashi Yamamoto, Takatsuki (JP); Masao Nakayama, Ritto (JP); Kaname Motoyoshi, Nishinomiya (JP)

(73) Assignee: Panasonic Corporation, Osaka (JP)

( * ) Notice: Subject to any disclaimer, the term of this patent is extended or adjusted under 35 U.S.C. 154(b) by 42 days.

(21) Appl. No.: 11/758,528

(22) Filed: Jun. 5, 2007

(65) Prior Publication Data

US 2007/0232252 A1    Oct. 4, 2007

Related U.S. Application Data

(62) Division of application No. 10/767,278, filed on Jan. 30, 2004, now Pat. No. 7,245,895.

(30) Foreign Application Priority Data

Feb. 6, 2003    (JP)    ............................. 2003-029694

(51) Int. Cl.
*H04B 1/06* (2006.01)
*H04B 7/00* (2006.01)

(52) U.S. Cl. .............. 455/249.1; 455/197.2; 455/236.1; 327/306; 327/330

(58) Field of Classification Search .............. 455/249.1, 455/197.2, 236.1, 550.1, 556.2, 575.1, 91, 455/95, 168.1, 334, 185.1; 348/726
See application file for complete search history.

(56) References Cited

U.S. PATENT DOCUMENTS 4,380,824 A    4/1983    Inoue 4,466,126 A    8/1984    Fujimoto (Continued)

FOREIGN PATENT DOCUMENTS

EP    0 889 584    1/1999

(Continued)

OTHER PUBLICATIONS

Japanese Office Action dated Oct. 17, 2006 with English translation.

(Continued)

*Primary Examiner*—Tony T Nguyen
(74) *Attorney, Agent, or Firm*—Dickinson Wright, PLLC

(57) ABSTRACT

A high frequency part, which amplifies a high frequency signal outputted from an intermediate frequency part and supplies to an antenna, is equipped with a gain controller with switch function. The gain controller with switch function comprises an attenuator with switch function has a function of switching a selected band between two bands outputted from the intermediate frequency part and controlling the gain of the high frequency signal in the selected band. The attenuator with switch function comprises a first variable resistor which connects a signal input part with a signal output part and a second variable resistor which is disposed parallel to said first variable resistor and connects a signal input part with a signal output part. The first and the second variable resistors are controlled by a common gain control voltage and set such that the gain control voltage ranges, which are for changing the resistor values, will not overlap with each other.

14 Claims, 17 Drawing Sheets

U.S. PATENT DOCUMENTS

| | | | |
|---|---|---|---|
| 5,303,268 | A | 4/1994 | Tsutsumi et al. |
| 5,483,209 | A | 1/1996 | Takayama |
| 5,903,178 | A | 5/1999 | Miyatsuji et al. |
| 6,229,370 | B1 | 5/2001 | Inamori et al. |
| 7,092,043 | B2 * | 8/2006 | Vorenkamp et al. .......... 348/726 |
| 7,236,212 | B2 * | 6/2007 | Carr et al. ................... 348/726 |

FOREIGN PATENT DOCUMENTS

| | | |
|---|---|---|
| JP | 02039681 | 2/1990 |
| JP | 08228138 | 9/1996 |
| JP | 11186921 | 7/1999 |
| JP | 11346131 | 12/1999 |

OTHER PUBLICATIONS

European Search Report dated Jan. 15, 2008.

* cited by examiner

ATTENUATOR WITH SWITCH FUNCTION AND MOBILE TELEPHONE TERMINAL DEVICE USING THE SAME

This is a divisional of application Ser. No. 10/767,278 filed Jan. 30, 2004, the entire content of which is expressly incorporated by reference herein.

BACKGROUND OF THE INVENTION

1. Field of the Invention

The present invention relates to a dual-band (mode) mobile telephone terminal device, and more particularly, to the structures of an attenuator and a switch of a high frequency part disposed inside a radio part of such a mobile telephone terminal device.

2. Description of the Related Art

A digital method (such as PDC) requires that the intensity of an electric wave received by a base station from a mobile telephone terminal device remains constant regardless of a change of a distance between the mobile telephone terminal device and the base station. Hence, a sender part of the mobile telephone terminal device performs gain control.

FIG. 9 schematically shows a positional relationship between a base station and a mobile telephone terminal device. In FIG. 9, one base station BS has a cell range CL which is at a radius of dozens of kilometers, e.g., about 30 km. Within the cell range CL of this base station BS, there are more than one mobile telephone terminal devices $TH_1$ and $TH_2$ which are not at the same distance from the base station BS or which are not under the same telecommunications conditions such as geography. These more than one mobile telephone terminal devices $TH_1$ and $TH_2$, while constantly changing their distances from the base station BS or the telecommunications conditions, simultaneously communicate with the base station BS.

In such a situation, considering the size of the cell range CL, the gain control width in the sender part of the mobile telephone terminal device must be about 50 dB or more so that the intensity of an electric wave received by the base station from the mobile telephone terminal device will be the same between the closest place to the base station BS and the farthest place from the base station BS within the cell range CL of the base station BS. This is known as the near-far problem.

If the sender part of the mobile telephone terminal device fails to achieve excellent gain control, the intensity of an electric wave reaching the base station will mount as the distance between the mobile telephone terminal device and the base station decreases. This will increase leakage power to a neighboring channel. As a result, the digital error rate will grow and the speech quality will deteriorate.

FIG. 10 shows the intensities of receive signals on the respective channels within the base station and an inter-modulation distortion characteristic. In FIG. 10, the solid lines $A_1$ through $A_6$ denote the intensities of electric waves received by the base station on the respective channels and the broken line $B_4$ denotes the inter-modulation distortion characteristic on the channel $A_4$. From FIG. 10, it is seen that the intensities of electric waves received on the channels $A_3$ and $A_5$ are dominated by a distortion component on the channel $A_4$ which is denoted at the broken line $B_4$ and correct data therefore cannot be restored from the channels $A_3$ and $A_5$ which are adjacent to the channel $A_4$.

The sender part of the mobile telephone terminal device preferably performs gain control at its high frequency part, at which the level of a carrier signal is high, as much as possible in order to maintain a state that a ratio (C/N) of the carrier signal level to the noise level is high. This is because the level of the carrier signal is far higher than the level of a background noise at the high frequency part, and therefore, even when the gain is lowered at the high frequency part, the state that the carrier signal is far different from the noise level is maintained.

On the contrary, since the level of the carrier signal is low at an intermediate frequency part, when the gain is lowered at the intermediate frequency part, the difference between the level of the carrier signal and the level of a background noise becomes marginal and thus shrank difference between the carrier signal level and the background noise level will hence be directly passed on to the high frequency part.

For the purpose of gain control over the range of 50 dB or higher, within the sender part of the radio part of the mobile telephone terminal device, the high frequency part controls the gain stepwise and the intermediate frequency part controls the gain continuously. The use of both the gain control at the high frequency part and the gain control at the intermediate frequency part realizes gain control over the range of 50 dB or higher.

Gain control in a mobile telephone terminal device is performed in the following manner. That is, based on the intensity of a receive signal received by the mobile telephone terminal device, the mobile telephone terminal device sets a target value for sending power which is needed to maintain the intensity of the receive signal at the base station constant. The target value is compared with the actual sending power, a feedback control loop which makes the sending power follow the target value is built, and gain control is executed so that the sending power will be the same as the target value.

FIG. 11 shows a base station BS(A) using a band A (mode A) and its cell range CL(A) and a base station BS(B) using a band B (mode B) and its cell range CL(B). Also illustrated in FIG. 11 are mobile telephone terminal devices $TH_0$, $TH_1$, $TH_2$, $TH_3$ and $TH_4$ which are under different telecommunications conditions, that is, which are at different distances from the mobile telephone terminal device $TH_1$.

A dual-band (mode) mobile telephone terminal device, as shown in FIG. 11, switches between the bands (modes) when moving out from the cell range CL(A) of the base station BS(A) to the cell range CL(B) of the base station BS(B). The bands A and B indicate that the terminal device uses different frequency bands, while the modes A and B indicate that the terminal device uses different systems.

While gain control used to ensure that the intensities of electric waves received by the base station BS(A) from the mobile telephone terminal devices $TH_0$, $TH_1$, and $TH_2$ would be the same within the cell CL(A), instantly upon entry into the cell CL(B), the mobile telephone terminal devices $TH_0$, $TH_3$ and $TH_4$ switch the band (mode) and gain control then ensures that the intensities of electric waves reaching the base station BS(B) would be the same.

The structure and operations of a conventional mobile telephone terminal device will now be described with reference to FIG. 12. This mobile telephone terminal device, as shown in FIG. 12, is comprised of a baseband part 100 which is formed by a microcomputer logic part or the like and processes a speech signal and a radio part 200 which receives the speech signal processed by the baseband part 100 and communicates with a base station.

The radio part 200 comprises a sender part 210 which generates a send signal to the base station and a receiver part 220 which receives the send signal from the base station.

The sender part 210 comprises an intermediate frequency part 230, a band-A high frequency part 240 and a band-B high frequency part 250. The intermediate frequency part 230 modulates a speech signal fed from the baseband part 100, adjusts the gain of an intermediate frequency signal and performs mixing for frequency conversion. The high frequency parts 240 and 250 each amplify high frequency signals outputted from the intermediate frequency part 230 and supply to an antenna 300 via a switch 310.

The intermediate frequency part 230 is comprised of a modulator 231 which modulates an intermediate frequency signal in accordance with the speech signal fed from the baseband part 100, a variable gain intermediate frequency amplifier 232 which amplifies, using a variable gain, the intermediate frequency signal which is an output signal from the modulator 231, and a mixer 233 which is for converting an output signal from the variable gain intermediate frequency amplifier 232 into a high frequency.

The variable gain intermediate frequency amplifier 232 described above is formed by a bipolar transistor in many instances. The variable gain intermediate frequency amplifier 232 is capable of varying the gain over the range of about 30 dB at the linearity of ±1 dB. In this case, the gain is continuously controlled over the range of about 30 dB, by means of a gain control voltage which changes continuously.

The high frequency part 240 is comprised of a variable gain high frequency amplifier 241 which amplifies, using a variable gain, the band-A high frequency signal outputted from the intermediate frequency part 230, a power amplifier 242 which power-amplifies an output from the variable gain high frequency amplifier 241 and a switch 245 which is for selecting the band A. The variable gain high frequency amplifier 241 described above is capable of varying the gain over the range of about 20 dB at the linearity of ±1 dB. In this case, the gain is continuously controlled over the range of about 20 dB, by means of a gain control voltage which changes continuously.

The variable gain high frequency amplifier 241 is comprised of a preamplifier (intermediate power amplifier) 243 and an attenuator 244 which is cascaded with the preamplifier 243 and varies the gain of the band-A high frequency signal which is supplied to the power amplifier (high power amplifier) 242. The attenuator 244 is equipped with a function of changing the attenuation over the range of about 20 dB at the linearity of ±1 dB.

The high frequency part 250 is comprised of a variable gain high frequency amplifier 251 which amplifies, using a variable gain, the band-B high frequency signal outputted from the intermediate frequency part 230, a power amplifier 252 which power-amplifies an output from the variable gain high frequency amplifier 251 and a switch 255 which is for selecting the band B. The variable gain high frequency amplifier 251 described above is capable of varying the gain over the range of about 20 dB at the linearity of ±1 dB. In this case, the gain is continuously controlled over the range of about 20 dB, by means of a gain control voltage which changes continuously.

The variable gain high frequency amplifier 251 is comprised of a preamplifier (intermediate power amplifier) 253 and an attenuator 254 which is cascaded with the preamplifier 253 and varies the gain of the band-B high frequency signal which is supplied to the power amplifier (high power amplifier) 252. The attenuator 254 is equipped with a function of changing the attenuation over the range of about 20 dB at the linearity of ±1 dB.

The baseband part 100 includes a control part 110. The control part 110 judges the band for the high frequency signal to be sent based on the receive signal received at the receiver part 220 and adds a switch voltage $V_{SW}(A)$ to the switch 245 while adding a switch voltage $V_{SW}(B)$ to the switch 255, thereby selecting the band for the high frequency signal to be sent.

During a telecommunication in the frequency band of the band A, the control part 110 detects the signal intensity of the receive signal received at the receiver part 220, detects the output level of the power amplifier 242, and sets a target value for the output level of the power amplifier 242 in accordance with the signal intensity of the receive signal. The output level of the power amplifier 242 is compared with the target value for the output level of the power amplifier 242, a gain control voltage $V_C(A)$ corresponding to the comparison result is added to the attenuator 244, and a gain control voltage $V_C(C)$ corresponding to the comparison result is similarly added to the variable gain intermediate frequency amplifier 232. In this manner, the gain at the attenuator 244 and the gain at the variable gain intermediate frequency amplifier 232 are follow-up controlled so that the output level of the power amplifier 242 will coincide with the target value for the output level of the power amplifier 242.

Meanwhile, during a telecommunication in the frequency band of the band B, the control part 110 detects the signal intensity of the receive signal reaching the receiver part 220, detects the output level of the power amplifier 252, and sets a target value for the output level of the power amplifier 252 in accordance with the signal intensity of the receive signal. The output level of the power amplifier 252 is compared with the target value for the output level of the power amplifier 252, a gain control voltage $V_C(B)$ corresponding to the comparison result is added to the attenuator 254, and a gain control voltage $V_C(C)$ corresponding to the comparison result is similarly added to the variable gain intermediate frequency amplifier 232. In this manner, the gain at the attenuator 254 and the gain at the variable gain intermediate frequency amplifier 232 are follow-up controlled so that the output level of the power amplifier 252 will coincide with the target value for the output level of the power amplifier 252.

Utilizing both gain control at the variable gain high frequency amplifier 241 or the variable gain high frequency amplifier 251 and gain control at the variable gain intermediate frequency amplifier 232, the mobile telephone terminal device described above realizes gain control over the range of 50 dB or higher.

In accordance with the PDC standard, an input stage of the mixer 233 operates in the 200 MHz band while an output stage of the mixer 233 operates in the 940 or 1441 MHz band. As for the signal levels at the respective parts in such a state that the mobile telephone terminal device yields the maximum output, the signal level at an output terminal of the power amplifier 242 or the power amplifier 252 is +30 dBm (where 0 dBm=1 mW), the signal level at an output terminal of the variable gain high frequency amplifier 241 or the variable gain high frequency amplifier 251 is +8 dBm, the signal level at an output terminal of the switch 245 or the switch 255 is −16 dBm, the signal level at an output terminal of the mixer 233 is −15 dBm, and the signal level at an output terminal of the variable gain intermediate frequency amplifier 232 is −20 dBm.

When the variable gain high frequency amplifier 241 controls the gain over the range of 20 dB and the variable gain intermediate frequency amplifier 232 controls the gain over the range of 30 dB, the signal level at the output terminal of the variable gain intermediate frequency amplifier 232 changes in the range of −20 dBm through −50 dBm. Meanwhile, the signal level at the output terminal of the mixer 233 changes in the range of −15 dBm through −45 dBm. The signal level at the output terminal of the switch 245 or the switch 255 changes in the range of −16 dBm through −46 dBm. The signal level at the output terminal of the variable gain high frequency amplifier 241 or the variable gain high frequency amplifier 251 changes in the range of +8 dBm through −42 dBm. The signal level at the output terminal of the power amplifier 242 or the power amplifier 252 changes in the range of +30 dBm through −20 dBm.

The specific structures of the attenuator 244 (254) and the switch 245 (255) and their operations at the time of switching of the band will now be described with reference to FIGS. 13 through 15.

FIG. 13 is a circuit diagram which shows the structure of the attenuator 244 (254). Such an attenuator 244 (254) controls the gain. The attenuator 244 (254) is comprised of a resistor 2 (12) and a field effective transistor 1 (11) which serves as a series variable resistor, as shown in FIG. 13.

Disposed to the attenuator 244 (254) are a gain control voltage applying terminal 5 (15) which is for applying a gain control voltage $V_C$, a source voltage applying terminal 6 (16) for applying a power source voltage $V_{DD}$, an input terminal 3 (13) which serves as a signal input part IN for the high frequency signal, and an output terminal 4 (14) which serves as a signal output part OUT for the high frequency signal.

The input terminal 3 described above is connected with the output terminal of the switch 245, while the output terminal 4 is connected with an input terminal of the preamplifier 243. The resistor 2 plays a role of blocking leakage of the high frequency signal. Meanwhile, the input terminal 13 is connected with the output terminal of the switch 255 which is shown in FIG. 12, and the output terminal 14 is connected with an input terminal of the preamplifier 253. The resistor 12 plays a role of blocking leakage of the high frequency signal.

FIG. 14 is a circuit diagram which shows the structure of the switch 245 (255). Such a switch 245 (255) switches the band. The switch 245 (255) is formed by a resistor 22 (32) and a field effective transistor 21 (31) which serves as a series variable resistor, as shown in FIG. 14.

Disposed to the switch 245 (255) are a switch voltage applying terminal 26 (36) which is for applying a switch voltage $V_{SW}(A)$ ($V_{SW}(B)$), a gate voltage applying terminal 25 (35) which is for applying a ground voltage, namely, a reference voltage GND, an input terminal 23 (33) which serves as a signal input part IN for the high frequency signal, and an output terminal 24 (34) which serves as a signal output part OUT for the high frequency signal.

The input terminal 23 described above is connected with the output terminal of the mixer 233 which is shown in FIG. 12, while the output terminal 14 is connected with an input terminal of the attenuator 244. The resistor 22 plays a role of blocking leakage of the high frequency signal. Meanwhile, the input terminal 33 is connected with the output terminal of the mixer 233 which is shown in FIG. 12, and the output terminal 34 is connected with an input terminal of the attenuator 254. The resistor 32 plays a role of blocking leakage of the high frequency signal.

FIG. 15 is a drawing which shows voltage control characteristics of the attenuator 244, the attenuator 254, the switch 245 and the switch 255 relative to a position to which the mobile telephone terminal device has moved. In FIG. 15, the gain control voltages $V_C(A)$ and $V_C(B)$ and the switch voltages $V_{SW}(A)$ and $V_{SW}(B)$ are shown.

Operations of the attenuators 244 and 254 and the switches 245 and 255 having such structures described above will now be described. The mobile telephone terminal device is driven at a voltage of up to about 3.0 V by a lithium battery or the like. The threshold voltages of the field effective transistors respectively represent a bias at which the variable resistors initiate the gain control operation and a bias at which the switches initiate the switching operation. The ground voltage (reference voltage) is applied to the gate voltage applying terminal 25 (35) of the field effective transistor 21 (31).

In the cell CL (A) which uses the band A, L (0 V) is applied to the switch voltage applying terminal 26 of the switch 245 to thereby select the band A, while H (3.0 V) is applied to the switch voltage applying terminal 36 of the switch 255 as the band B is not selected. Since the distance from the base station BS(A) is the shortest within the cell CL(A) when the mobile telephone terminal device is located at the spot denoted at $TH_1$, the minimum value (0.5 V) is applied as the gain control voltage $V_C(A)$ to the gain control voltage applying terminal 5 so that the attenuation at the attenuator 244 will become maximum.

In this case, when the mobile telephone terminal device moves from the spot denoted at $TH_1$ to the spot denoted at $TH_0$, the gain control voltage $V_C(A)$ applied to the gain control voltage applying terminal 5 sequentially changes from the minimum value (0.5 V) to the maximum value (2.5 V) to thereby ensure that the attenuation at the attenuator 244 will change from the maximum to the minimum.

Simultaneously with the arrival of the mobile telephone terminal device at the spot denoted at $TH_0$, within the cell CL(B) which uses the band B, L (0 V) is applied to the switch voltage applying terminal 36 of the switch 255 to thereby select the band B and H (3.0 V) is applied to the switch voltage applying terminal 26 of the switch 245 as the band A is not selected. In this situation, since a distance between the mobile telephone terminal device ($TH_0$) and the base station BS(B) within the cell CL(B) is the longest, the maximum value (2.5 V) is applied as the gain control voltage $V_C(B)$ to the gain control voltage applying terminal 15 so that the attenuation at the attenuator 254 will become minimum.

Further, when the mobile telephone terminal device moves from the spot denoted at $TH_0$ to the spot denoted at $TH_4$, the gain control voltage $V_C(B)$ applied to the gain control voltage applying terminal 15 sequentially changes from the maximum value (2.5 V) to the minimum value (0.5 V) to thereby ensure that the attenuation at the attenuator 254 will change from the minimum to the maximum.

Meanwhile, in the variable gain intermediate frequency amplifier 232, the gain control voltage $V_C(C)$ is changed independently of selection of either the band A or B, whereby the output level changes continuously.

FIG. 16 is a timing chart which shows the timing at which the attenuators shown in FIG. 13 and the switches shown in FIG. 14 operate in response to the switching of the band in accordance with moving between the cells. Shown in FIG. 16 are changes of the level $P_{OUT}$ (SW(B)) of the output signal from the switch 255 and the level $P_{OUT}$ (ATT(B)) of the output signal from the attenuator 254.

Problems with the conventional technique will now be described with reference to FIG. 16. When switching from the band A to the band B is attained by means of a combination of the switches 245 and 255 and the attenuators 244 and 254, it takes scores of microseconds until the switch 255 has stably turned on since application of the switch voltage for instance as shown in FIG. 16 at the time of the switching of the band, and therefore, the gain control voltage $V_C(B)$ is applied to the gain control voltage applying terminal 15 of the attenuator 254 with a delay which is equivalent to this transient response time of the switch 255. Hence, differences of the characteristics of the attenuator 254, the variable gain intermediate frequency amplifier 232 and the like could give rise to a variation in desired gain of the mobile telephone terminal device immediately after the switching of the band.

FIG. 17 is a drawing for describing the problem above with the conventional technique. FIG. 17 shows changes of the level $P_{OUT}$ of the output signal from the antenna in a situation that the mobile telephone terminal device is communicating under an ideal condition while moving away from the base station at a constant speed.

In relation to the situation described with reference to FIG. 16, such a situation will now be considered that the mobile telephone terminal device is communicating under an ideal condition while moving away from the base station at a constant speed.

Within the cell CL(B), owing to the gain control function, the level $P_{OUT}$ of the output signal from the mobile telephone terminal device is normally supposed to decrease linearly. However, in the situation as described above, as shown in FIG. 17, the delayed follow-up operation attributed to a delay of feedback control and the discontinuity of the output level occurring at the time of the switching of the band temporarily pushes out the level $P_{OUT}$ of the output signal of the mobile telephone terminal device off from the linear line at the time of the switching of the band. As this happens, the intensity of the receive signal at the base station deviates from the specified value, a difference develops between the levels of the receive signals on the adjacent channels, and the speech therefore gets disturbed or the speech quality deteriorates.

Although the foregoing has described this problem in relation to an example that the mobile telephone terminal device is moving under an ideal condition, actual conditions of moving are much worse, including such a situation that the intensity of the receive signal abruptly drops low as the mobile telephone terminal device gets behind a building. The problem that the intensity of the receive signal at the base station deviates from the specified value is thus believed to be rampant, adding to the difficulty of the deteriorated speech quality.

In addition, the control part 110 of the baseband part 100 needs be set up with the three types of the gain control voltages $V_C(A)$, $V_C(B)$ and $V_C(C)$ to control the variable gain high frequency amplifier 241, the variable gain high frequency amplifier 251 and the variable gain intermediate frequency amplifier 232, and further, with the two types of the switch voltages $V_{SW}(A)$ and $V_{SW}(B)$, which demands complicated control for the control part 110.

Further, since the high frequency part 240 and the high frequency part 250 respectively require the switch 245 and the switch 255, the circuitry structure is complex and a large space is necessary. This leads to another problem that the mobile telephone terminal device as a whole becomes large.

SUMMARY OF THE INVENTION

An object of the present invention is to provide an attenuator with switch function which has a simple structure and yet realizes signal switch control and signal gain control.

Other object of the present invention is to provide a mobile telephone terminal device which is capable of realizing a high-quality call.

Still other object of the present invention is to provide a mobile telephone terminal device which simplifies a structure for band switch control and gain control.

Another object of the present invention is to provide a mobile telephone terminal device which realizes a space-saving compact size.

A first attenuator with switch function according to the present invention comprises: a first variable resistor inserted in a first signal line which connects a first signal input part with a first signal output part; and a second variable resistor inserted in a second signal line which is disposed parallel to the first signal line and connects a second signal input part with a second signal output part, wherein as the attenuation of each one of the first and the second variable resistors is controlled by means of a gain control voltage, either one of outputs on the first and the second signal lines is blocked and the gain of the remaining output on the first and the second signal lines is controlled linearly and continuously. The first and the second variable resistors described above are formed by at least one or more field effective transistors which are connected in series, for instance.

This structure uses a series variable resistor which is inserted in the first signal line and formed by at least one or more field effective transistors for instance and a series variable resistor which is inserted in the second signal line and formed by at least one or more field effective transistors for instance, and the selected signal line is switched by controlling the attenuation of each variable resistor, and in substance, the variable resistor on the selected signal line linearly controls the gain of the signal on the signal line. Hence, with a simple structure, it is possible to select a signal line and control the signal gain on the selected signal line.

A second attenuator with switch function according to the present invention comprises: a first variable resistor inserted in a first signal line which connects a first signal input part with a first signal output part; a second variable resistor inserted in a second signal line which is disposed parallel to the first signal line and connects a second signal input part with a second signal output part; a first and a second reference voltage applying parts which are connected respectively with the first and the second variable resistors; and a gain control voltage applying part which is connected with each one of the first and the second variable resistors via a common gain control line. The first and the second variable resistors described above are formed by at least one or more field effective transistors which are connected in series, for instance.

This structure uses a series variable resistor which is inserted in the first signal line and formed by at least one or more series-connected field effective transistors for instance and a series variable resistor which is inserted in the second signal line and formed by at least one or more series-connected field effective transistors for instance, and operations of the at least two or more series variable resistors disposed parallel are shifted by an amount which is equivalent to at least the gain control (switch) operation range or more, and the operation ranges of the respective series variable resistors are set so as to correspond to the mutually different gain control voltage ranges. In addition, the gain control voltage range of the series variable resistor connected to the first signal line is substantially continuous with the gain control voltage range of the series variable resistor connected to the second signal line, whereby the signal line is switched and the gain is controlled using only one type of gain control voltage. Hence, a variation of the gain at the time of switching of the selected signal line is eliminated and it is possible to perform the gain control operation in response to the switching of the signal line at an extremely high accuracy.

A structure for shifting the operations of the at least two or more series variable resistors disposed parallel by an amount which is equivalent to at least the gain control operation range or more may be a structure in which reference voltages are applied respective to the source of the field effective transistor which serves as one of the series variable resistors and the gate of the field effective transistor which serves as the other one of the series variable resistors, for example. Since the gain is controlled and switching is controlled using only one type of gain control voltage in such a structure, it is possible to control the gain at an extremely high accuracy. Further, it is possible to freely change the setting of the gain control operation voltage.

For instance, the second attenuator with switch function according to the present invention described above has a structure that the first variable resistor has a structure that a first resistor is connected at least with the gate of a first field effective transistor the second variable resistor has a structure that a second resistor is connected at least with the gate of a second field effective transistor, the gate of the first field effective transistor is connected with the gain control voltage applying part via the first resistor and the gain control line, the source of the second field effective transistor is connected with the gain control voltage applying part via the gain control line, the source of the first field effective transistor is connected with the first reference voltage applying part, and the gate of the second field effective transistor is connected with the second reference voltage applying part via the second resistor.

It is preferable that a voltage applied to the second reference voltage applying part is lower than a voltage applied to the first reference voltage applying part.

To be more specific, it is preferable that a voltage applied to the second reference voltage applying part is lower, by a value which is calculated by subtracting a difference between gain control voltages which completely turn off the first and the second field effective transistors from the sum of the threshold voltage of the first field effective transistor and the threshold voltage of the second field effective transistor, than a voltage applied to the first reference voltage applying part.

Further, it is preferable that the values of voltages applied to the first and the second reference voltage applying parts are set such that the gain control voltage range over which the first variable resistor performs a gain control operation will not overlap with the gain control voltage range over which the second variable resistor performs a gain control operation.

Further, it is preferable that the values of voltages applied to the first and the second reference voltage applying parts are set such that the gain control voltage range over which the second variable resistor performs a gain control operation will be lower than the gain control voltage range over which the first variable resistor performs a gain control operation.

Further, it is preferable that the values of voltages applied to the first and the second reference voltage applying parts are set such that a gain control voltage which completely turns off the second field effective transistor will be lower than a gain control voltage which completely turns off the first field effective transistor.

In other example of the structure of the second attenuator with switch function according to the present invention described above, the first variable resistor has a structure that a first resistor is connected at least with the gate of a first field effective transistor; the second variable resistor has a structure that a second resistor is connected at least with the gate of a second field effective transistor; the gate of the first field effective transistor is connected with the gain control voltage applying part via the first resistor and the gain control line; the source of the second field effective transistor is connected with the gain control voltage applying part via the gain control line; a third resistor is inserted between the source of the first field effective transistor and a portion which is connected with the gate of the second field effective transistor via the second resistor; a fourth resistor is inserted between the portion, which is connected with the gate of the second field effective transistor via the second resistor, and a basic potential portion; and the source of the first field effective transistor is connected with the first reference voltage applying part.

A third attenuator with switch function according to the present invention comprises: a series circuit of a first and a second variable resistors which are inserted in at least one first signal line which connects a first signal input part with a first signal output part; a third variable resistor inserted in a second signal line which connects a second signal input part with a second signal output part; and a fourth variable resistor inserted in a third signal line which connects a third signal input part with a third signal output part, wherein as the attenuation of each one of the first, the second, the third and the fourth variable resistors is controlled by means of a gain control voltage, the gain of either one of outputs on the first, the second and the third signal lines is controlled linearly and continuously and the remaining ones of the first, the second and the third signal lines are blocked. The first, the second, the third and the fourth variable resistors described above are formed by at least one or more field effective transistors which are connected in series, for instance.

Although being different from that of the first attenuator with switch function in that there are three or more signal lines on which the gain can be controlled, this structure is otherwise the same as that of the first attenuator with switch function.

A fourth attenuator with switch function according to the present invention comprises: a series circuit of a first and a second variable resistors which are inserted in at least one first signal line which connects a first signal input part with a first signal output part; a third variable resistor inserted in a second signal line which connects a second signal input part with a second signal output part; a fourth variable resistor inserted in a third signal line which connects a third signal input part with a third signal output part; a first, a second, a third and a fourth reference voltage applying parts which are connected respectively with the first, the second, the third and the fourth variable resistors; and a gain control voltage applying part which is connected with each one of the first, the second, the third and the fourth variable resistors via a common gain control line. The first, the second, the third and the fourth variable resistors described above are formed by at least one or more field effective transistors which are connected in series, for instance.

Although being different from that of the second attenuator with switch function in that there are three or more signal lines on which the gain can be controlled, this structure is otherwise the same as that of the second attenuator with switch function.

A first mobile telephone terminal device according to the present invention uses the first attenuator with switch function according to the present invention for the purpose of switching of a selected band between two bands and for the purpose of gain control in the selected band.

In this structure, the first attenuator with switch function according to the present invention is used. In this attenuator with switch function, the selected band is switched by controlling the attenuation of each variable resistor, and in substance, the variable resistor on the selected band linearly controls the sending output. This solves a problem of a delay due to a transient response time of a switch associated with switching of the band, prevents a situation that an output from the mobile telephone device terminal temporarily deviates from a desired linear line at the time of switching of the band because of a delayed follow-up operation caused by delayed feedback control or the discontinuity of the output level occurring at the time of the switching of the band, and realizes a high-quality call. Further, since this requires merely gain control for switching of the selected band, control for switching of the band is simplified. In addition, this permits to omit switches for switching of the band in a high frequency part, saves the space and achieves a small size.

A second mobile telephone terminal device according to the present invention uses the second attenuator with switch function according to the present invention for the purpose of switching of a selected band between two bands and for the purpose of gain control in the selected band.

In this structure, the second attenuator with switch function according to the present invention is used. Operations of the series variable resistors, which are formed by at least two or more field effective transistors disposed parallel, are shifted by an amount which is equivalent to at least the gain control (switch) operation range or more, and the operation ranges of the respective series variable resistors are set so as to correspond to the mutually different gain control voltage ranges. In addition, the gain control voltage range of the series variable resistor connected to the first signal line is substantially continuous with the gain control voltage range of the series variable resistor connected to the second signal line, whereby the band is switched and the gain is controlled using only one type of gain control voltage. Hence, a variation of the gain at the time of switching of the selected band is eliminated and it is possible to perform the gain control operation in response to the switching of the band at an extremely high accuracy.

As a result, the mobile telephone terminal device which is fabricated using such an attenuator with switch function above solves a problem of a delay due to a transient response time of a switch associated with switching of the band, prevents a situation that an output from the mobile telephone device terminal temporarily deviates from a desired linear line at the time of switching of the band because of a delayed follow-up operation caused by delayed feedback control or the discontinuity of the output level occurring at the time of the switching of the band, and realizes a high-quality call. Further, since this requires merely gain control for switching of the selected band, control for switching of the band is simplified. In addition, this permits to omit switches for switching of the band, saves the space and achieves a small size.

A third mobile telephone terminal device according to the present invention is characterized in using the third attenuator with switch function according to the present invention for the purpose of switching of a selected band between three or more bands and for the purpose of gain control in the selected band.

Although being different from that of the first mobile telephone terminal device in that there are three or more signal lines on which the gain can be controlled, this structure is otherwise the same as that of the first mobile telephone terminal device.

A fourth mobile telephone terminal device according to the present invention is characterized in using the fourth attenuator with switch function according to the present invention for the purpose of switching of a selected band between three or more bands and for the purpose of gain control in the selected band.

Although being different from that of the second mobile telephone terminal device in that there are three or more signal lines on which the gain can be controlled, this structure is otherwise the same as that of the second mobile telephone terminal device.

A fifth mobile telephone terminal device according to the present invention comprises a baseband part, which processes a speech signal and a radio part, which receives the speech signal processed by the baseband part and communicates with a base station. The radio part is comprised of a sender part which generates a send signal to the base station and a receiver part which receives the send signal from the base station. The sender part is comprised of an intermediate frequency part, which is formed by a modulator which modulates an intermediate frequency signal in accordance with the speech signal which is provided from the baseband part a variable gain intermediate frequency amplifier which controls the gain of the intermediate frequency signal and a mixer which performs mixing for frequency conversion from the intermediate frequency signal into a high frequency signal, and a high frequency part which amplifies the high frequency signal outputted from the intermediate frequency part and supplies to an antenna. The high frequency part is comprised of a gain controller with switch function, which switches a selected band between two bands outputted from the intermediate frequency part and controls the gain of the high frequency signal in the selected band, and two power amplifiers which respectively power-amplify two outputs from the gain controller with switch function. The gain controller with switch function includes an attenuator with switch function which switches a selected band between two bands outputted from the intermediate frequency part and controls the gain of the high frequency signal in the selected band.

The baseband part includes a control part. The control part detects signal information about a receive signal received by the receiver part and adds a gain control voltage corresponding to this information to the attenuator with switch function so that an output from either one of the two power amplifiers is taken over by an output from the other one of the two power amplifiers; a target value for the output level of the other one of the two power amplifiers is then set in accordance with the signal information about the receive signal; the output level of the other one of the two power amplifiers is compared with the target value for the output level of the other one of the two power amplifiers; a gain control voltage corresponding to the result of the comparison is added to the attenuator with switch function and the variable gain intermediate frequency amplifier, thereby follow-up controlling the gains of the attenuator with switch function and the variable gain intermediate frequency amplifier such that the output level of the other one of the two power amplifiers will become equal to the target value for the output level of the other one of the two power amplifiers.

As an attenuator with switch function, the first attenuator with switch function according to the present invention is used. This attenuator with switch function switches from the output from one power amplifier to the output from another power amplifier, and controls the gain of the output from another power amplifier linearly and continuously.

In this attenuator with switch function, the first attenuator with switch function according to the present invention is used. In this attenuator with switch function, the selected band is switched by controlling the attenuation of each variable resistor, and in substance, the variable resistor on the selected band linearly controls the output from the power amplifier. This solves a problem of a delay due to a transient response time of a switch associated with switching of the band, prevents a situation that an output from the mobile telephone device terminal temporarily deviates from a desired linear line at the time of switching of the band because of a delayed follow-up operation caused by delayed feedback control or the discontinuity of the output level occurring at the time of the switching of the band, and realizes a high-quality call. Further, since this requires merely gain control for switching of the selected band at the high frequency part, control for switching of the band is simplified. In addition, this permits to omit switches for switching of the band in a high frequency part, saves the space and achieves a small size.

A sixth mobile telephone terminal device according to the present invention uses the second attenuator with switch function according to the present invention as an attenuator with switch function, and is otherwise the same as the fifth mobile telephone terminal device.

In this structure, the second attenuator with switch function according to the present invention is used as an attenuator with switch function. Operations of the series variable resistors, which are formed by at least two or more field effective transistors disposed parallel for instance, are shifted by an amount which is equivalent to at least the gain control (switch) operation range or more, and the operation ranges of the respective series variable resistors are set so as to correspond to the mutually different gain control voltage ranges. In addition, the gain control voltage range of the series variable resistor connected to the first signal line is substantially continuous with the gain control voltage range of the series variable resistor connected to the second signal line, whereby the band is switched and the gain is controlled using only one type of gain control voltage. Hence, a variation of the gain at the time of switching of the selected band is eliminated and it is possible to perform the gain control operation in response to the switching of the band at an extremely high accuracy.

As a result, the mobile telephone terminal device which is fabricated using such an attenuator with switch function above solves a problem of a delay due to a transient response time of a switch associated with switching of the band, prevents a situation that an output from the mobile telephone device terminal temporarily deviates from a desired linear line at the time of switching of the band because of a delayed follow-up operation caused by delayed feedback control or the discontinuity of the output level occurring at the time of the switching of the band, and realizes a high-quality call. Further, since this requires merely gain control for switching of the selected band at the high frequency part, control for switching of the band is simplified. In addition, this permits to omit switches for switching of the band in a high frequency part, saves the space and achieves a small size.

DETAILED DESCRIPTION OF PREFERRED EMBODIMENTS

The first preferred embodiment of the present invention will be described below with reference to FIGS. 1 through 6.

Figure 1:
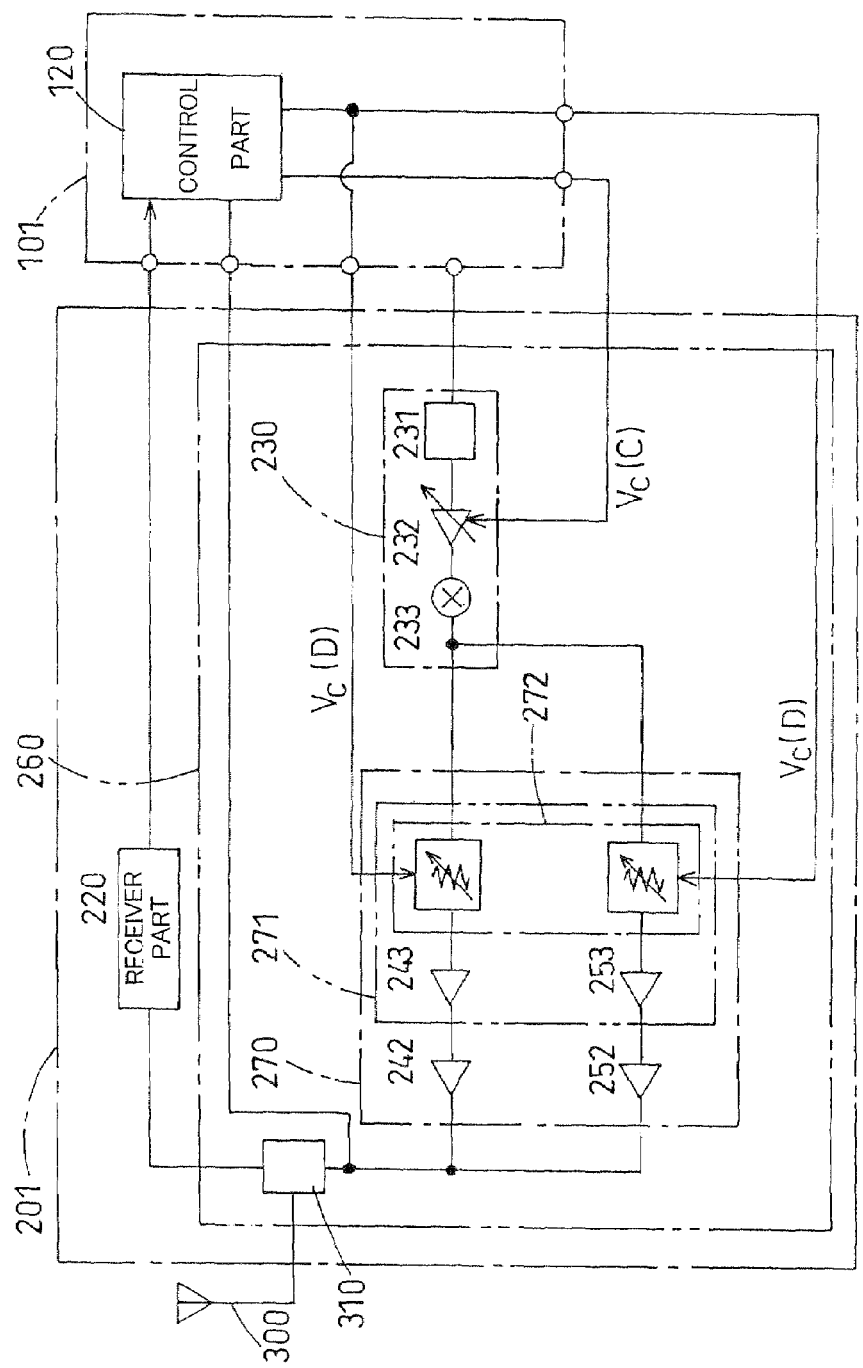
FIG. 1 is a block diagram which shows the structure of a mobile telephone terminal device according to a first preferred embodiment of the present invention.

FIG. 1 is a block diagram of a mobile telephone terminal device according to the first preferred embodiment of the present invention. The structure and operations of the mobile telephone terminal device according to the first preferred embodiment will now be described with reference to FIG. 1.

This mobile telephone terminal device is comprised of, as shown in FIG. 1, a baseband part 101 which is formed by a microcomputer logic part or the like and processes a speech signal and a radio part 201 which receives the speech signal processed by the baseband part 101 and communicates with a base station.

The radio part 201 comprises a sender part 260 which generates a send signal to the base station and a receiver part 220 which receives a send signal from the base station.

The sender part 260 is comprised of an intermediate frequency part 230 and a high frequency part 270. The intermediate frequency part 230 modulates a speech signal fed from the baseband part 101, adjusts the gain of an intermediate frequency signal and performs mixing for frequency conversion. The high frequency part 270 amplifies a high frequency signal outputted from the intermediate frequency part 230 and supplies to an antenna 300 via a switch 310.

The intermediate frequency part 230 is comprised of a modulator 231 which modulates an intermediate frequency signal in accordance with the speech signal fed from the baseband part 101, a variable gain intermediate frequency amplifier 232 which amplifies, using a variable gain, the intermediate frequency signal which is an output signal from the modulator 231, and a mixer 233 which is for converting an output signal from the variable gain intermediate frequency amplifier 232 into a high frequency.

The variable gain intermediate frequency amplifier 232 described above is formed by a bipolar transistor in many instances. The variable gain intermediate frequency amplifier 232 is capable of varying the gain over the range of about 30 dB at the linearity of ±1 dB. In this case, the gain is continuously controlled over the range of about 30 dB, by means of a gain control voltage which changes continuously.

The high frequency part 270 is comprised of a gain controller with switch function 271 which switches the selected band for and controls the gain of the high frequency signal outputted from the intermediate frequency part 230, a power amplifier 242 which power-amplifies an output in the band A from the gain controller with switch function 271, and a power amplifier 252 which power-amplifies an output in the band B from the gain controller with switch function 271. The gain controller with switch function 271 is capable of switching the selection of the band A or B and varying the gain over the range of about 20 dB at the linearity of ±1 dB in the selected band. In this case, the band switching/selecting operation is executed in response to a gain control voltage which changes continuously and the gain is continuously controlled over the range of about 20 dB or higher.

The gain controller with switch function 271 is comprised of a preamplifier (intermediate power amplifier) 243 for the band A, a preamplifier (intermediate power amplifier) 253 for the band B, and an attenuator with switch function 272. The attenuator with switch function 272 is cascaded with the preamplifier 243 and selects/switches a band-A high frequency signal which is fed to the power amplifier (high power amplifier) 242 while simultaneously varying the gain. Further, the attenuator with switch function 272 is cascaded with the preamplifier 253 and selects/switches a band-B high frequency signal which is fed to the power amplifier (high power amplifier) 252 while simultaneously varying the gain.

The attenuator with switch function 272, as described above, switches the selection of the band A or B and varies the gain over the range of about 20 dB at the linearity of ±1 dB in the selected band. To this end, the attenuator with switch function 272 has a switch isolation value of 20 dB or higher and is equipped with a function of varying the gain over the range of about 20 dB or higher as the attenuation of the attenuators.

Although this embodiment requires that power is amplified in the band A through the two stages of amplifiers which are the preamplifier 243 and the power amplifier 242 but amplified in the band B through the two stages of amplifiers which are the preamplifier 253 and the power amplifier 252, power may be amplified in the bands A and B each through one stage of amplifier.

The baseband part 101 includes a control part 120 which is formed by a microcomputer logic part or the like. The control part 120 detects the signal intensity of the receive signal reaching the receiver part 220. At the same time, in the band A, the control part 120 detects the output level of the power amplifier 242 and sets a target value for the output level of the power amplifier 242 in accordance with the signal intensity of the receive signal. The output level of the power amplifier 242 is compared with the target value for the output level of the power amplifier 242, a gain control voltage $V_C(D)$ corresponding to the comparison result is added to the attenuator with switch function 272, while the gain control voltage $V_C(C)$ is added to the variable gain intermediate frequency amplifier 232. In this manner, the gain at the attenuator with switch function 272 and the gain at the variable gain interme-diate frequency amplifier 232 are follow-up controlled so that the output level of the power amplifier 242 will coincide with the target value for the output level of the power amplifier 242.

Further, in the band B, the control part 120 detects the output level of the power amplifier 252 and sets a target value for the output level of the power amplifier 252 in accordance with the signal intensity of the receive signal. The output level of the power amplifier 252 is compared with the target value for the output level of the power amplifier 252, the gain control voltage $V_C(D)$ corresponding to the comparison result is added to the attenuator with switch function 272, while the gain control voltage $V_C(C)$ is added to the variable gain intermediate frequency amplifier 232. In this manner, the gain at the attenuator with switch function 272 and the gain at the variable gain intermediate frequency amplifier 232 are follow-up controlled so that the output level of the power amplifier 252 will coincide with the target value for the output level of the power amplifier 252.

Utilizing both gain control at the gain controller with switch function 271 and gain control at the variable gain intermediate frequency amplifier 232, the mobile telephone terminal device described above realizes gain control over the range of 50 dB or higher at the linearity of ±1 dB in the selected band. According to the PDC standard, the input stage of the mixer 233 operates in the 200 MHz band while the output stage of the mixer 233 operates in the 940 or 1441 MHz band. It is +30 dBm (where 0 dBm=1 mW) at the output terminal of the power amplifier 242 or the power amplifier 252, it is +8 dBm at the output terminal of the preamplifier 243 or the preamplifier 253, it is −16 dBm at the output terminal of the attenuator with switch function 272, it is −15 dBm at the output terminal of the mixer 233, and it is −20 dBm at the output terminal of the variable gain intermediate frequency amplifier 232.

When the gain controller with switch function 271 controls the gain over the range of 20 dB and the variable gain intermediate frequency amplifier 232 controls the gain over the range of 30 dB, the signal level at the output terminal of the variable gain intermediate frequency amplifier 232 changes in the range of −20 dBm through −50 dBm. Meanwhile, the signal level at the output terminal of the mixer 233 changes in the range of −15 dBm through −45 dBm. The signal level at the output terminal of the attenuator with switch function 272 changes in the range of −16 dBm through −36 dBm. The signal level at the output terminal of the preamplifier 243 or the preamplifier 253 changes in the range of +8 dBm through −42 dBm. The signal level at the output terminal of the power amplifier 242 or the power amplifier 252 changes in the range of +30 dBm through −20 dBm.

The specific structure and operations of the attenuator with switch function 272 will now be described with reference to FIGS. 2 through 6.

Figure 2:
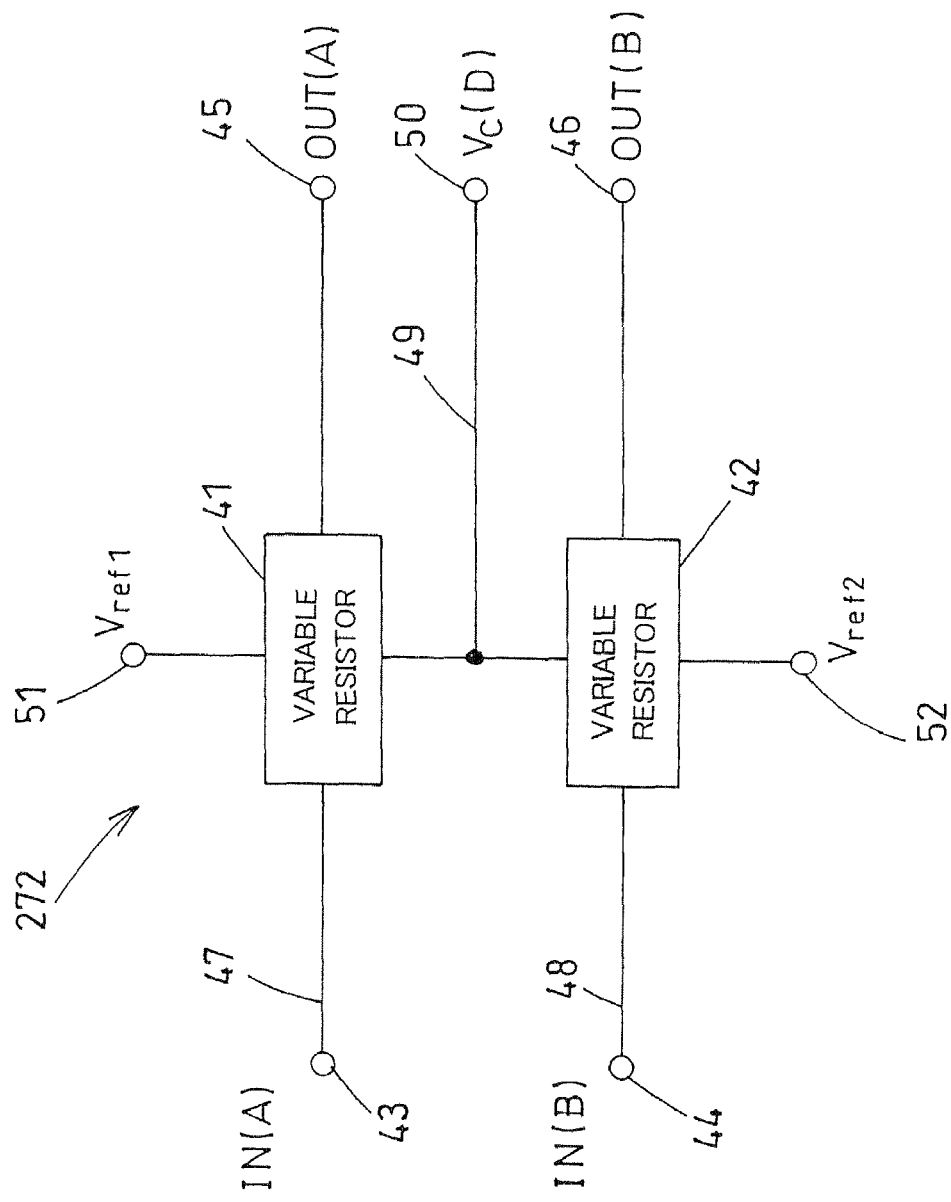
FIG. 2 is a block diagram which shows the structure of an attenuator with switch function disposed within the mobile telephone terminal device which is shown in FIG. 1.
Figure 3:
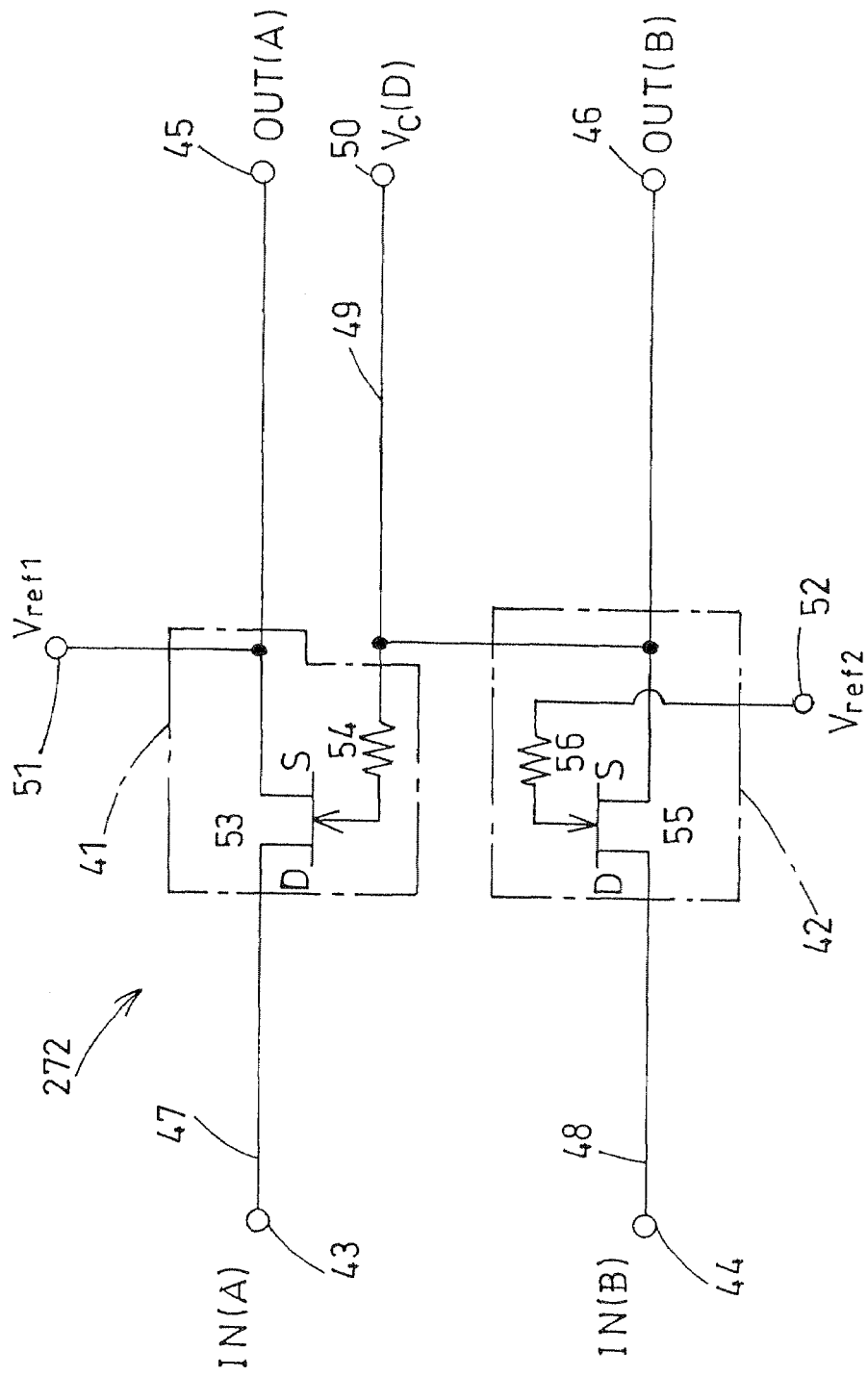
FIG. 3 is a circuitry diagram which shows the specific structure of the attenuator with switch function which is shown in FIG. 2.

FIG. 2 is a schematic block diagram which shows the structure of the attenuator with switch function 272 which is formed by a semiconductor integrated circuit device, and FIG. 3 is a circuitry diagram which shows the specific structure of the attenuator with switch function 272. This attenuator with switch function 272 is integrated on one GaAS semiconductor substrate. Such a structure can be integrated also on a silicon substrate, and particularly in the case of a substrate of silicon or silicon-germanium, etc., a microcomputer logic part can also be integrated at the same time.

When switching of the selected band and control of the gain is realized by means of at least one series variable resistor in each band using such an attenuator with switch function 272, during gain control at the time of the switching of the band, control to a desired gain in a shorter period of time is possible as compared to where a switch and an attenuator are both used. This in consequence makes it possible to switch the selected band and control the gain simultaneously in each band alone, without providing a structure combining a switch and an attenuator for each band. When more parallel variable resistors are used, it is possible to achieve excellent gain control at the time of switching across more bands (modes).

In the attenuator with switch function 272, as shown in FIGS. 2 and 3, a signal line 47, which connects an input terminal 43 serving as a signal input part IN(A) for the high frequency signal with an output terminal 45 serving as a signal output part OUT(A) for the high frequency signal, is disposed parallel to a signal line 48 which connects an input terminal 44 serving as a signal input part IN(B) for the high frequency signal with an output terminal 46 serving as a signal output part OUT(B) for the high frequency signal.

A series variable resistor 41 formed by at least one or more field effective transistors is inserted in the signal line 47. A series variable resistor 42 formed by at least one or more field effective transistors is inserted in the signal line 48.

The variable resistor 41 and the variable resistor 42 are connected by a gain control line 49. In the attenuator with switch function 272, reference voltage applying terminals 51 and 52 which act as reference voltage applying parts are connected respectively with the variable resistors 41 and 42 and reference voltages $V_{ref1}$ and $V_{ref2}$ are fed respectively to the reference voltage applying terminals 51 and 52. Further, a gain control voltage applying terminal 50 which acts as a gain control voltage applying part is connected with each one of the variable resistors 41 and 42 via the gain control line 49.

The variable resistors 41 and 42 are formed respectively by what are obtained by connecting resistors 54 and 56 with the gates of field effective transistors 53 and 55. The field effective transistor 53 which forms the variable resistor 41 on the signal line 47 has its drain connected with the input terminal 43 and its source connected with the output terminal 45. Meanwhile, the field effective transistor 55 which forms the variable resistor 42 on the signal line 48 has its drain connected with the input terminal 44 and its source connected with the output terminal 46.

In addition, the field effective transistor 53 which forms the variable resistor 41 has its gate connected with the gain control voltage applying terminal 50 via the resistor 54 and the gain control line 49, and the field effective transistor 55 which forms the variable resistor 42 has its source connected with the gain control voltage applying terminal 50 via the gain control line 49.

The reference voltage $V_{ref1}$ is applied from the reference voltage applying terminal 51 to the source of the field effective transistor 53 which forms the variable resistor 41, while the reference voltage $V_{ref2}$ is applied from the reference voltage applying terminal 52 to the gate of the field effective transistor 55 which forms the variable resistor 42.

To block intrusion of the high frequency signal, a lower limit value and a higher limit value are set for the resistors 54 and 56 described above in the following manner for instance. First, the lower limit value is 1 kΩ. The reason is because but for the isolation of 20 dB or higher, the switching characteristics and the gain control characteristics will be influenced, e.g., intrusion of the high frequency signal and an increased loss. The set value above ensures the isolation of 20 dB or higher.

The higher limit value is 100 kΩ. The reason is as follows. When the field effective transistors carry a gate-leak current of 1 μA for example, the voltage drop $V_{DROP}$ at the resistors inserted in the gates of the field effective transistors are:

$$V_{DROP} = 1 \times 10^{-6} \times 100 \times 10^3 = 0.1 \text{ (V)}$$

where the resistance value of the resistors is 100 kΩ. In other words, if the resistance value exceeds 100 kΩ, the control voltage will deviate beyond 0.1 V, thereby exerting a measurable influence over the gain control characteristics.

Operations of the attenuator with switch function 272 having such a structure will now be described. The mobile telephone terminal device is driven at a voltage of up to about 3.0 V by a lithium battery or the like. The threshold voltages of the field effective transistors respectively represent a bias at which the variable resistors initiate the gain control operation, namely, a bias at which the field effective transistors completely turn off (pinch-off). Such field effective transistors having the equal threshold voltage $V_{th}$ for instance are used as the field effective transistors which form the variable resistors 41 and 42. In this example, the threshold voltage $V_{th}$ is −0.5 V, for example.

The mutually different reference voltages $V_{ref1}$ and $V_{ref2}$ are applied respectively to the reference voltage applying terminals 51 and 52 of the variable resistors 41 and 42. The different reference voltages $V_{ref1}$ and $V_{ref2}$ applied to the reference voltage applying terminals 51 and 52 of the variable resistors 41 and 42 will now be described.

The variable resistors formed by the field effective transistors completely turn off (pinch off) when a gate-source voltage $V_{GS}$ becomes smaller than the threshold voltage $V_{th}$ of the field effective transistors ($V_{GS} \leq V_{th}$), and shows the maximum resistance value. The gate-source voltage $V_{GS}$ of each field effective transistor is expressed as a difference ($V_G - V_S$) between a gate voltage $V_G$ and a source voltage $V_S$, and the resistance value changes depending upon a combination of the gain control voltage $V_C(D)$ and the reference voltages $V_{ref1}$ and $V_{ref2}$. Hence, as the set values of the reference voltages $V_{ref1}$ and $V_{ref2}$ are changed, the range of the gain control voltage $V_C(D)$, over which the gain is controlled (i.e., the attenuation is controlled) using the variable resistors, is controlled.

As for the gain control voltage $V_C(D)$, the range of the gain control voltage $V_C(D)$ which each one of the variable resistors 41 and 42 affects may be set such that the ranges of the linear gain control operations of the variable resistors 41 and 42 will not overlap in substance with each other. Although the variable resistor 42 is disposed on the low-voltage side and the variable resistor 41 is disposed on the high-voltage side in this example, their ranges may be set freely.

Assume now that the threshold value (pinch-off) voltage of the field effective transistor 53 of the variable resistor 41 is defined as $V_{th1}$, the threshold value (pinch-off) voltage of the field effective transistor 55 of the variable resistor 42 is defined as $V_{th2}$, a gain control voltage which completely turns off (pinches off) the field effective transistor 53 of the variable resistor 41 is defined as $V_{COFF(A)}$, and a gain control voltage which completely turns off (pinches off) the field effective transistor 55 of the variable resistor 42 is defined as $V_{COFF(B)}$. Since the gate-source voltage $V_{GS}$ of each field effective transistor is expressed as the difference ($V_G - V_S$) between the gate voltage $V_G$ and the source voltage $V_S$, $$V_{th1} = V_{COFF(A)} - V_{ref1} \tag{1}$$

$$V_{th2} = V_{COFF(B)} - V_{ref2} \tag{2}$$

As one can see from the equations (1) and (2), as the gain control voltage increases, the gain control operation of the field effective transistor 53 changes from OFF to ON and the gain control operation of the field effective transistor 55 changes from ON to OFF. In short, the gain control operations of these field effective transistors 53 and 55 change in a complementary manner. This is because the gain control voltage is applied to the gate of the field effective transistor 53 while the gain control voltage is applied to the source of the field effective transistor 55.

This is expressed as:

$$\Delta V = V_{COFF(A)} - V_{COFF(B)} \quad (3)$$

where $\Delta V$ denotes a difference between the gain control voltages $V_{COFF(A)}$ and $V_{COFF(B)}$. It is necessary to set the difference $\Delta V$ as a positive value. That is, the gain control voltage $V_{COFF(A)}$ needs be set to a larger value than the gain control voltage $V_{COFF(B)}$.

With these settings, the field effective transistor 55 can execute the gain control operation when the field effective transistor 53 is completely OFF, and the field effective transistor 53 can execute the gain control operation when the field effective transistor 55 is completely OFF. In other words, when one of the field effective transistors 53 and 55 is completely OFF, the other one of the field effective transistors 53 and 55 can execute the gain control operation. Such operations mean that it is possible to carry out the switching operation and the gain control operation at the same time.

It is further necessary that the difference $\Delta V$ is set to such a value which is not influenced by a variation of the threshold value voltage of each field effective transistor during fabrication, a change caused by a temperature change, etc. Considering that variations of the threshold value voltages of the field effective transistors during fabrication are about ±0.1 V and changes associated with temperature changes are about ±0.1 V, the difference $\Delta V$ needs be set to a value which is at least equal to or larger than 0.4 V.

The maximum value of the difference $\Delta V$ needs be set about 2.0 V or lower. This is because a value which can be outputted as a gain control voltage from the control part of the baseband part is within the range of 0 through about 3.0 V. In short, it is necessary to set the gain control voltages $V_{COFF(A)}$ and $V_{COFF(B)}$ within this range, and it is necessary to set this value to about 2.0 V or lower so as to execute the gain control operation without an influence by changes associated with temperature changes or the like. This preferred embodiment requires that $V_{COFF(A)} = 1.5$ V, $V_{COFF(B)} = 1.0$ V and $\Delta V = 0.5$ V.

Substituting the equation (1) in the equation (3), the following is obtained:

$$V_{COFF(B)} = V_{ref1} + V_{th1} - \Delta V \quad (4)$$

Further substituting the equation (4) in the equation (2) the following is obtained:

$$V_{ref2} = V_{ref1} + V_{th1} + V_{th2} - \Delta V \quad (5)$$

Now, assuming that $V_{th1} = V_{th2} = V_{th}$, $$V_{ref2} = V_{ref1} + 2V_{th} - \Delta V \quad (6)$$

The equation (5) shows it is necessary that the voltage $V_{ref2}$ applied to the reference voltage applying part 52 of the field effective transistor 55 is set to be lower, by a value which is calculated by subtracting the difference $\Delta V$ between the gain control voltages $V_{COFF(A)}$ and $V_{COFF(B)}$ which completely turn off the field effective transistors 53 and 55 from the sum of the threshold voltage $V_{th1}$ of the field effective transistor 53 and the threshold voltage $V_{th2}$ of the field effective transistor 55, than the voltage $V_{ref1}$ applied to the reference voltage applying part 51 of the field effective transistor 53.

Meanwhile, the equation (6) shows it is necessary that the voltage $V_{ref2}$ applied to the reference voltage applying part 52 of the field effective transistor 55 is set to be a voltage value which is lower, by a value which is calculated by subtracting the difference $\Delta V$ between the gain control voltages $V_{COFF(A)}$ and $V_{COFF(B)}$ which completely turn off the field effective transistors 53 and 55 from double the threshold voltage values $V_{th}$ of the field effective transistors 53 and 55, than the voltage $V_{ref1}$ applied to the reference voltage applying part 51 of the field effective transistor 53.

In this preferred embodiment, since $V_{th} = -0.5$ V and $\Delta V = 0.5$ V, $$V_{ref2} = V_{ref1} - 1.5 \quad (7)$$

Thus, the voltage $V_{ref2}$ needs be set lower by 1.5 V than the voltage $V_{ref1}$. In this preferred embodiment therefore, $V_{ref1} = 2.0$ V and $V_{ref2} = 0.5$ V.

As described above, when switching of the selected band and control of the gain in the selected band is to be realized simultaneously, the reference voltage $V_{ref1}$ of the variable resistor 41 and the reference voltage $V_{ref2}$ of the variable resistor 42 are each appropriately set, so that the ranges of the gain control operations of the variable resistor 41 in the band (A) and the variable resistor 42 in the band (B) become complementary with each other and switching of the selected band and control of the gain in the selected band can be achieved at the same time using one gain control voltage.

Figure 4:
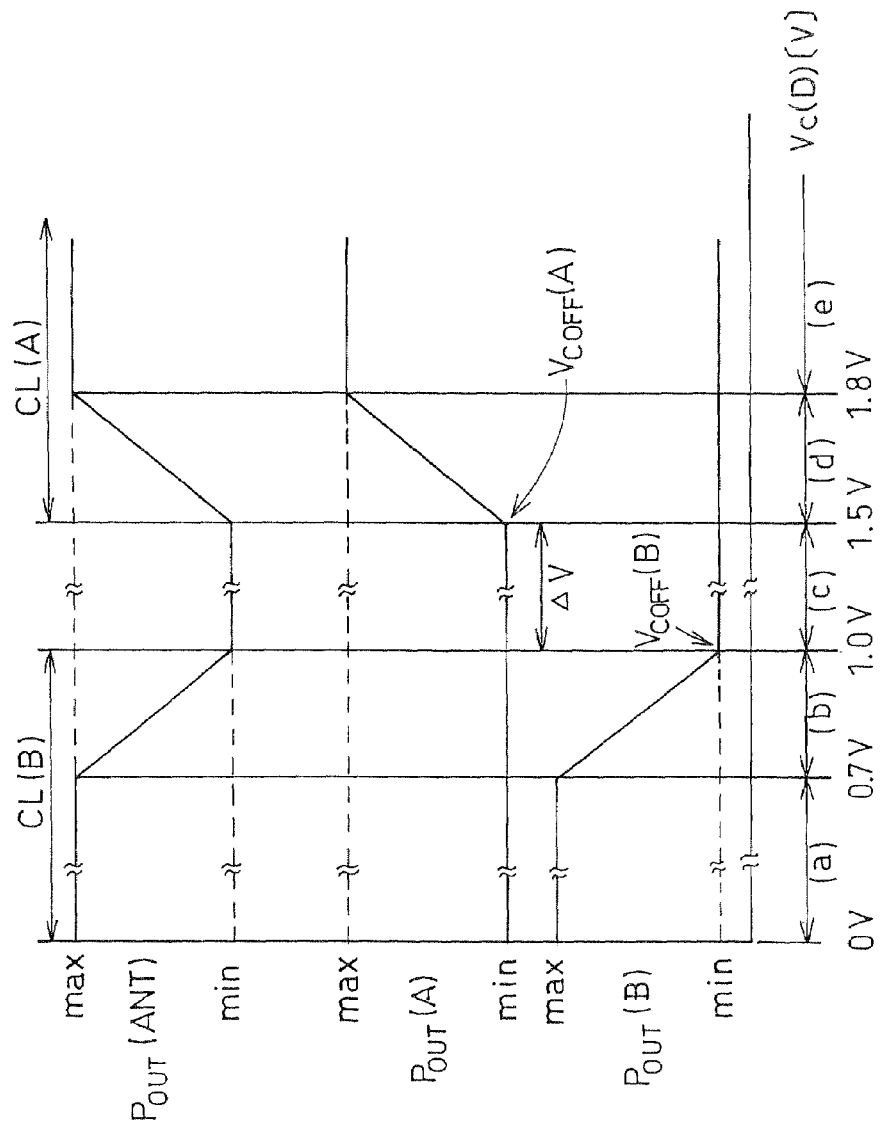
FIG. 4 is a chart which shows switch and gain control characteristics relative to a gain control voltage within the attenuator with switch function which is shown in FIG. 3.

FIG. 4 is a gain control characteristics chart which shows a change of the gain (attenuation) in response to the gain control voltage $V_C(D)$ of the attenuator with switch function 272 which is shown in FIG. 3. Operations of the attenuator with switch function 272 shown in FIG. 3 will now be described with reference to FIG. 4.

When the threshold voltage values $V_{th}$ of the field effective transistors are all -0.5 V, the reference voltage $V_{ref1}$ is set to 2.0 V and the reference voltage $V_{ref2}$ is set to 0.5 V.

In the event that a voltage of 0 through 0.7 V is applied to the gain control voltage applying terminal 50 (FIG. 4: the gain control voltage range (a)), the resistance value $R_{ON}$ of the variable resistor 41 (FET 53) is maximum and the resistance value $R_{ON}$ of the variable resistor 42 (FET 55) is minimum. Hence, on a signal received at the input terminals 43 and 44, the level $P_{OUT}(A)$ of the output signal at the output terminal 45 becomes minimum and the level $P_{OUT}(B)$ of the output signal at the output terminal 46 becomes maximum. This is a state in which the band (B) is selected and the band (A) is not selected.

In the event that a voltage exceeding 0.7 V is applied to the gain control voltage applying terminal 50 (FIG. 4: the gain control voltage range (b)), while the resistance value $R_{ON}$ of the variable resistor 41 (FET 53) remains maximum, the resistance value $R_{ON}$ of the variable resistor 42 (FET 55) starts increasing. Hence, while the level $P_{OUT}(A)$ of the output signal at the output terminal 45 stays minimum, the level $P_{OUT}(B)$ of the output signal at the output terminal 46 decreases. The gain control voltage range in which a variable resistor formed by a field effective transistor performs a linear gain control operation would normally be from about 0.2 to about 0.3 V, and therefore, until application of a voltage of 1.0 V to the gain control voltage applying terminal 50, the gain would decrease about 20 dB linearly. This is a state in which the band (A) is not selected and the gain is controlled in the band (B) with the band (B) kept selected.

With application of a voltage of 1.0 V to the gain control voltage applying terminal 50 (FIG. 4: the gain control voltage range (c)), the resistance value $R_{ON}$ of the variable resistor 42 (FET 55) which used to increase reaches the maximum value and the resistance value $R_{ON}$ of the variable resistor 41 (FET 53) remains at the maximum value. Hence, the level $P_{OUT}(B)$ of the output signal at the output terminal 46 and the level $P_{OUT}(A)$ of the output signal at the output terminal 45 each become minimum. This is a state in which the band (A) is not selected and the band (B) switches from selected to non-selected.

With application of a voltage of 1.5 V to the gain control voltage applying terminal 50 (FIG. 4: the gain control voltage range (d)), while the resistance value $R_{ON}$ of the variable resistor 42 (FET 55) remains at maximum, the resistance value $R_{ON}$ of the variable resistor 41. (FET 53) which used to be maximum starts decreasing. Hence, while the level $P_{OUT}$(B) of the output signal at the output terminal 46 remains at the minimum value, the level $P_{OUT}(A)$ of the output signal at the output terminal 45 starts increasing. This is a state in which the band (A) switches from non-selected to selected, gain control is started in the band (A), and the band (B) is not selected.

Until application of a voltage of 1.8 V to the gain control voltage applying terminal 50, the level $P_{OUT}(A)$ of the output signal at the output terminal 45 increases about 20 dB linearly. During this, the resistance value $R_{ON}$ of the variable resistor 42 (FET 55) remains maximum. Because of this, the level $P_{OUT}$(B) of the output signal at the output terminal 46 remains at the minimum value.

With application of a voltage of 1.8 V to the gain control voltage applying terminal 50 (FIG. 4: the gain control voltage range (e)), the resistance value $R_{ON}$ of the variable resistor 42 (FET 55) remains maximum and the resistance value $R_{ON}$ of the variable resistor 41 (FET 53) which used to decrease reaches the minimum value. Hence, while the level $P_{OUT}$(B) of the output signal at the output terminal 46 remains at the minimum value, the level $P_{OUT}(A)$ of the output signal at the output terminal 45 becomes maximum. This is a state in which the band (A) is selected, the gain is controlled in the band (A), and the band (B) is not selected.

Even with application of a voltage of 1.8 V or higher to the gain control voltage applying terminal 50, the resistance value $R_{ON}$ of the variable resistor 41 (FET 53) stays at the minimum value and the resistance value $R_{ON}$ of the variable resistor 42 (FET 55) remains at the maximum value. Hence, the level $P_{OUT}$(B) of the output signal at the output terminal 46 remains minimum and the level $P_{OUT}(A)$ of the output signal at the output terminal 45 remains maximum.

FIG. 4 also shows the level $P_{OUT}$(ANT) of the output from the antenna 300.

As described above, using the structure that the variable resistors 41 and 42 formed by field effective transistors are connected parallel for the attenuators with switch function, this preferred embodiment ensures that each gain control operation range gets shifted thus avoiding overlapping of the gain control operation ranges of the variable resistors 41 and 42 with each other and hence that the gain control operations of the variable resistors 41 and 42 become complementary with each other. This makes it possible to realize switching of the selected band and control of the gain in the selected band at the same time in response to the control voltage. With the reference voltages adjusted by an external microcomputer, the gain control operation ranges of the variable resistors 41 and 42 are shifted.

Figure 5:
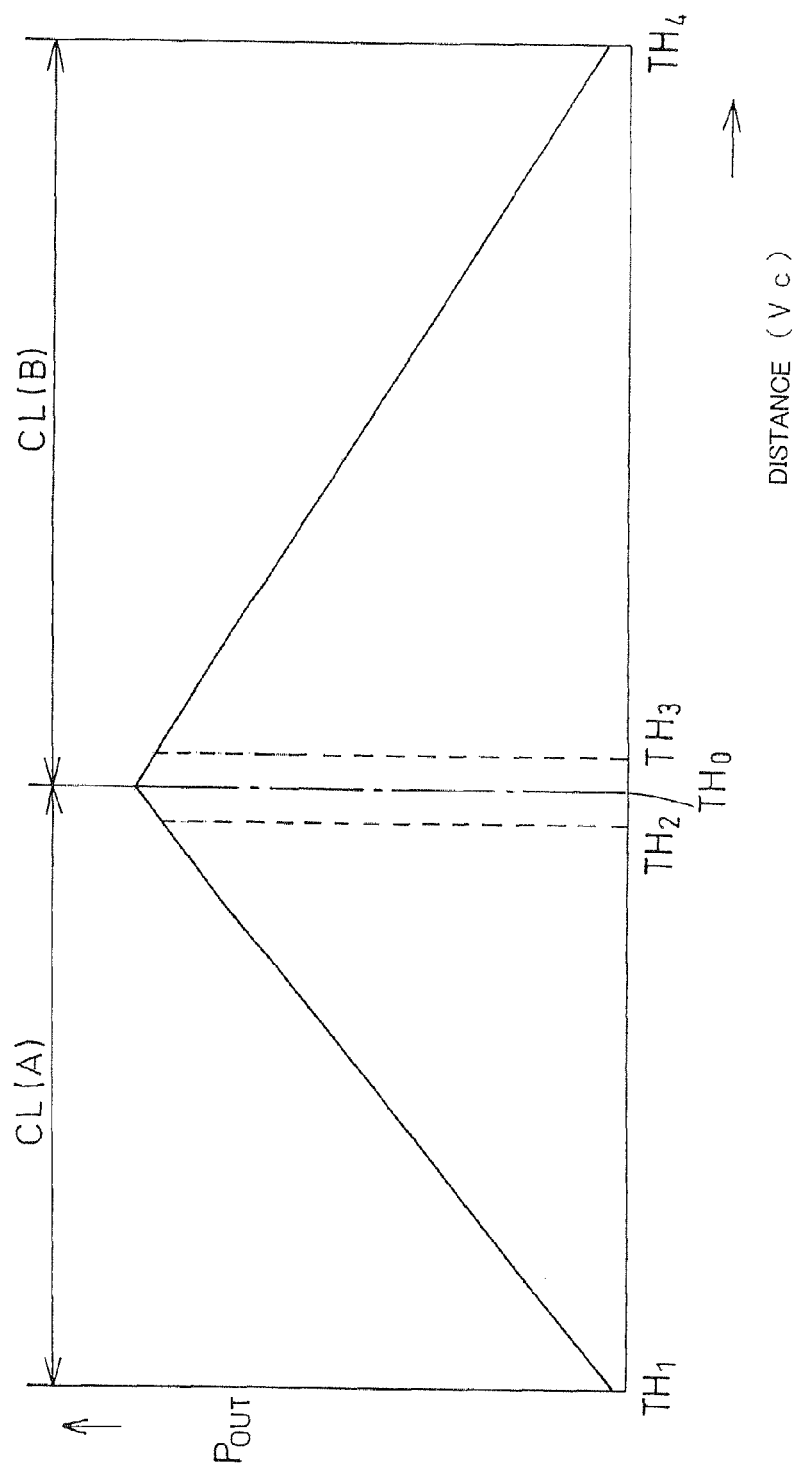
FIG. 5 is a characteristic chart which shows the output power of the mobile telephone terminal device observed within the attenuator with switch function which is shown in FIG. 3, relative to a distance from a base station while the mobile telephone terminal device moves between cells.
Figure 6:
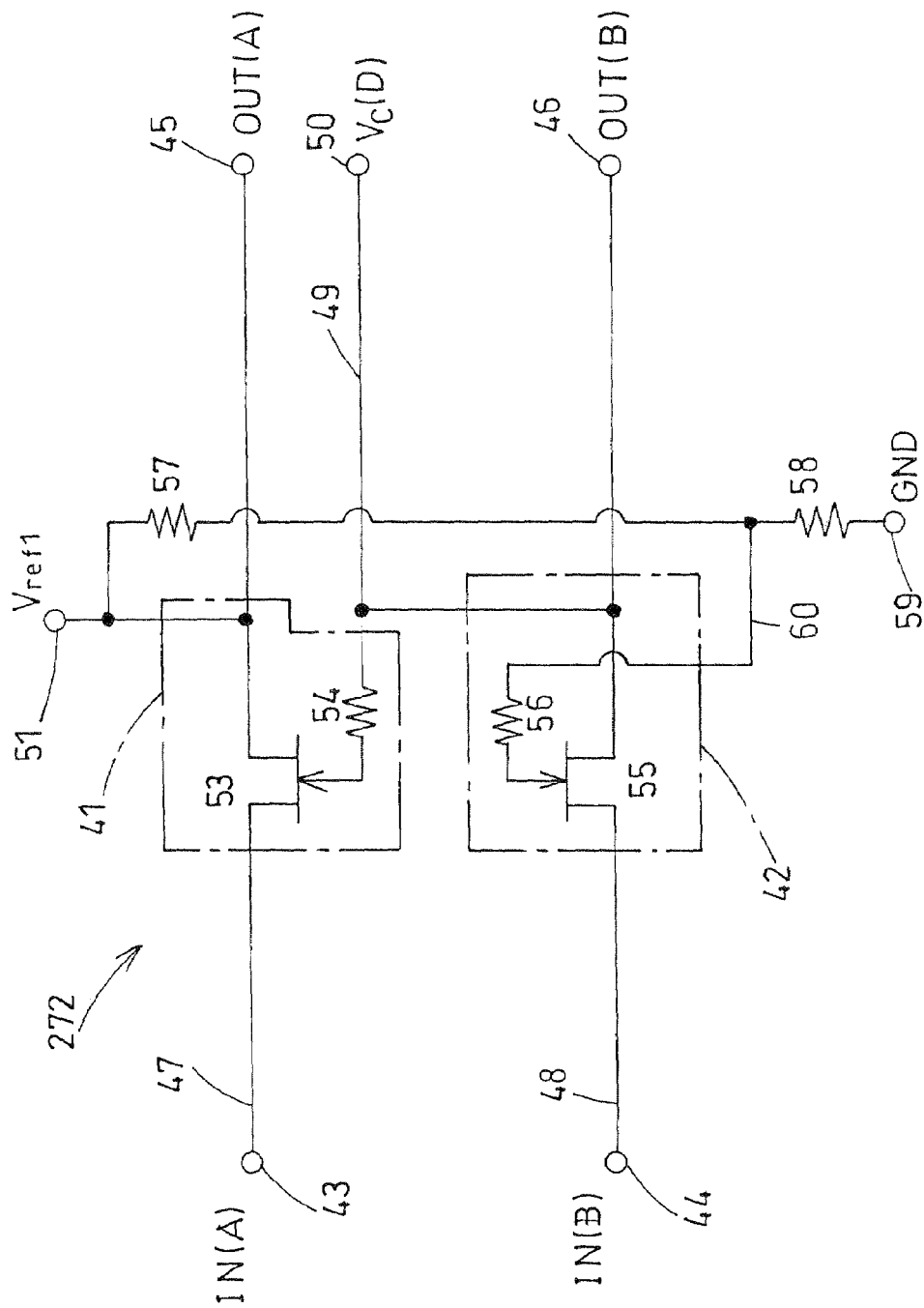
FIG. 6 is a circuitry diagram which shows the specific structure of the attenuator with switch function of FIG. 3 as it is modified to comprise bias resistors 57 and 58 so as to apply a reference voltage upon each variable resistor.
Figure 17:
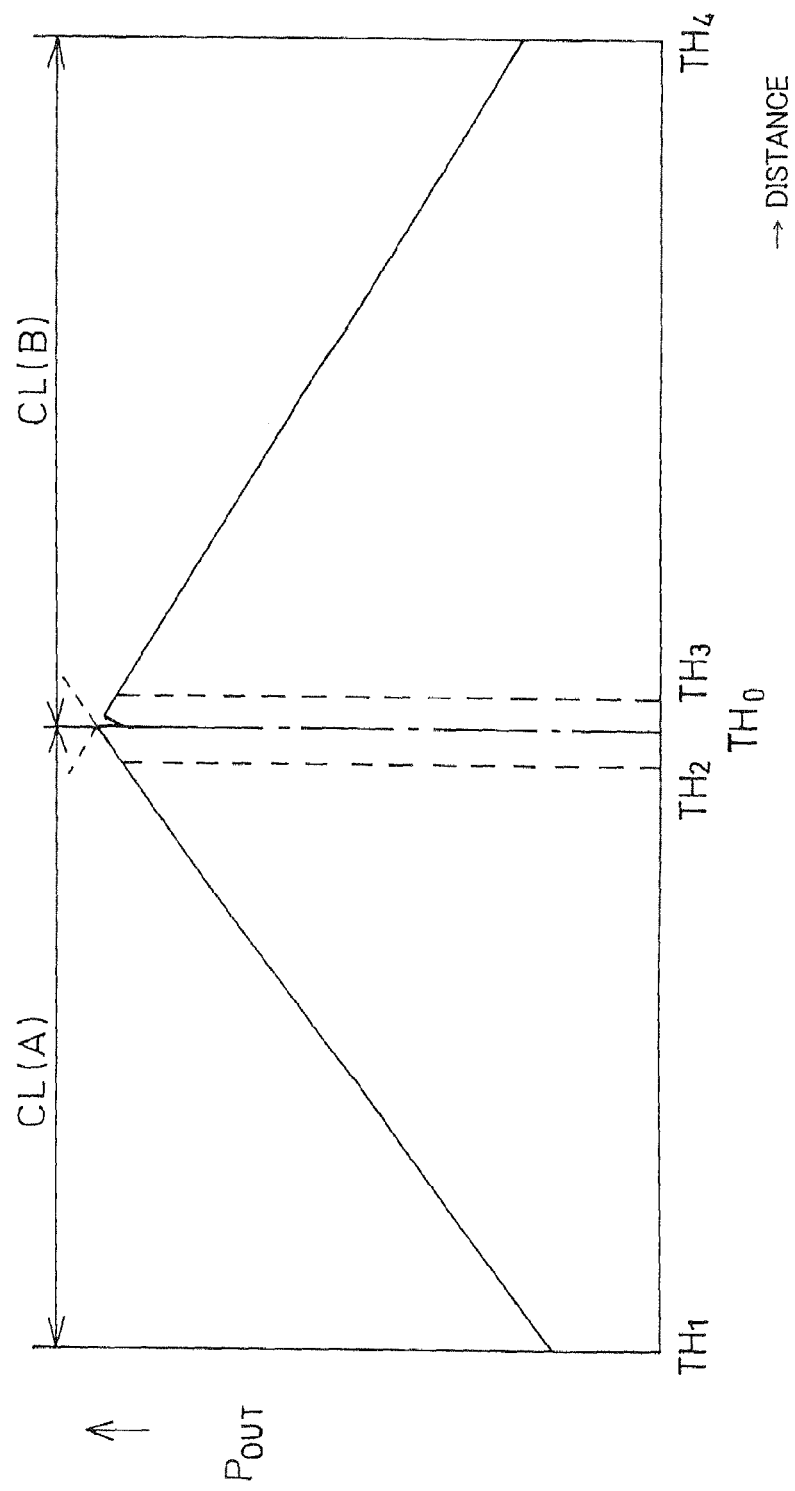
FIG. 17 is an explanatory drawing for describing the problem with the conventional technique.

Thus, at the high frequency part of the mobile telephone terminal device, using one semiconductor device, switching of the selected band and control of the gain in the selected band is realized. This allows to avoid a temporary deviation from the target values for the output levels of the power amplifiers which would otherwise occur upon switching of the band according to the conventional technique as shown in FIG. 17, and makes it easy as shown in FIG. 5 to highly accurately control the gain while the mobile telephone terminal device switches between the bands.

In addition, since only one type of gain control voltage setup is needed, it is possible to simplify the circuitry structure of the control part 120. It is also possible to omit the switches in the high frequency part, save the space and further reduce the size of the mobile telephone terminal device.

Further, although the reference voltage applying terminal 51 of the variable resistor 41 which is for the band (A) is separate from the reference voltage applying terminal 52 of the variable resistor 42 which is for the band (B) in the preferred embodiment described above, a structure as that shown in FIG. 6 may be used instead. That is, only the reference voltage applying terminal 51 may be disposed, thereby dividing the reference voltage $V_{ref1}$, which is applied to the variable resistor 41, across the bias resistors 57 and 58 and accordingly applying a reference voltage to the variable resistor 42. In this case, the circuit is simplified as only one reference voltage applying terminal is used. The bias resistors 57 and 58 each play a role of blocking intrusion of the high frequency signal. To prevent intrusion of the high frequency signal, the bias resistors 57 and 58 described above are set to a resistance value which is from about 5 kΩ to about 100 kΩ.

The reason of setting the bias resistors 57 and 58 to a resistance value which is from about 5 kΩ to about 100 kΩ will now be described.

First, the reason why the lower limit value is about 5 kΩ is as follows. The high frequency signal will be passed on to the ground (GND) and neither the switching operation nor the gain control operation is possible if the bias resistors 57 and 58 have small values, and therefore, the bias resistors 57 and 58 need be 5 kΩ or larger (isolation of 40 dB or higher). On the other hand, when the reference voltage $V_{ref1}$ is 3 V, a current carried by the bias resistors 57 and 58 is:

$I$=3 V/10 kΩ=300 μA or larger, thereby pushing up the power consumption.

Meanwhile, the reason why the lower limit value is 100 kΩ is as follows. When the reference voltage $V_{ref1}$ is 3 V, a current carried by the bias resistors 57 and 58 is:

$I$=3 V/200 kΩ=15 μA

Now, a voltage across the bias resistor 57 is:

V=15 μA×100 kΩ=1.5 V

At this stage, a leak current of 1 μA flowing through the field effective transistors would give rise to a bias variation of 1 μA×100 kΩ=0.1 V, thereby deviating the gain control characteristics and preventing accurate gain control.

Although the preferred embodiment described above requires the structure that the two variable resistors are disposed parallel, i.e., the variable resistor 41 which is for the band (A) and the variable resistor 42 which is for the band (B) both formed by field effective transistors, more variable resistors may be disposed parallel. The larger the number of the variable resistors disposed parallel is, the larger the number of the bands over which switching of the selected band and gain control can be realized is.

An example of an attenuator with switch function capable of controlling the gain over three bands will now be described with reference to FIGS. 7 and 8.

Figure 7:
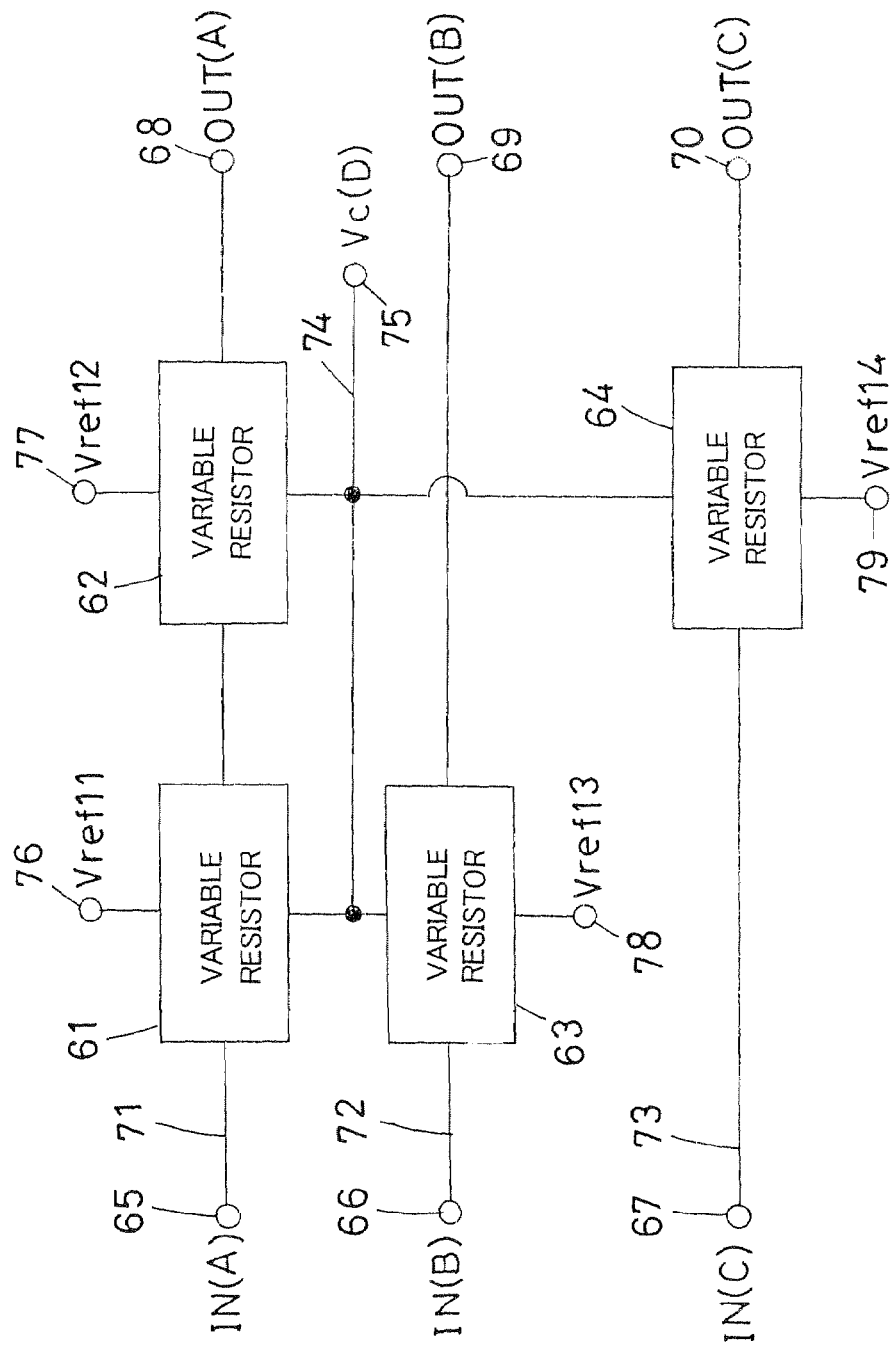
FIG. 7 is a block diagram which shows the structure of an attenuator with switch function according to a second preferred embodiment of the present invention.

In this attenuator with switch function, as shown in FIG. 7, a signal line 71, which connects an input terminal 65 serving as a signal input part IN (A) for the high frequency signal with an output terminal 68 serving as a signal output part OUT(A) for the high frequency signal, a signal line 72, which connects an input terminal 66 serving as a signal input part IN (B) for the high frequency signal with an output terminal 69 serving as a signal output part OUT(B) for the high frequency signal, and a signal line 73, which connects an input terminal 67 serving as a signal input part IN(C) for the high frequency signal with an output terminal 70 serving as a signal output part OUT(C) for the high frequency signal, are disposed parallel to each other.

Series variable resistors 61 and 62 formed by at least one or more field effective transistors are inserted in the signal line 71. A series variable resistor 63 formed by at least one or more field effective transistors is inserted in the signal line 72. A series variable resistor 64 formed by at least one or more field effective transistors is inserted in the signal line 73.

The variable resistor 61, the variable resistor 62, the variable resistor 63 and the variable resistor 64 are connected by a gain control line 74. In this attenuator with switch function, reference voltage applying terminals 76, 77, 78 and 79 which act as reference voltage applying parts are connected respectively with the variable resistors 61, 62, 63 and 64 and reference voltages $V_{ref11}$, $V_{ref12}$, $V_{ref13}$ and $V_{ref14}$ are fed respectively to the reference voltage applying terminals 76, 77, 78 and 79. Further, a gain control voltage applying terminal 75 which acts as a gain control voltage applying part is connected with each one of the variable resistors 61, 62, 63 and 64 via the gain control line 74.

The variable resistors 61, 62, 63 and 64 above are formed respectively by what are obtained by connecting resistors with the gates of at least field effective transistors, like those which are shown in FIG. 3.

The field effective transistor (not shown) which forms the variable resistor 61 has its drain connected with the input terminal 65 and its source connected with the drain of the field effective transistor (not shown) which forms the variable resistor 62. The field effective transistor which forms the variable resistor 62 has its source connected with the output terminal 68. The field effective transistor (not shown) which forms the variable resistor 63 has its drain connected with the input terminal 66 and its source connected with the output terminal 69. The field effective transistor (not shown) which forms the variable resistor 64 has its drain connected with the input terminal 67 and its source connected with the output terminal 70.

Further, the field effective transistor which forms the variable resistor 61 has its gate connected with the gain control voltage applying terminal 75 via the resistor and the gain control line 74. The field effective transistor which forms the variable resistor 62 has its source connected with the gain control voltage applying terminal 75 via the gain control line 74. The field effective transistor which forms the variable resistor 63 has its source connected with the gain control voltage applying terminal 75 via the gain control line 74. The field effective transistor which forms the variable resistor 64 has its gate connected with the gain control voltage applying terminal 75 via the resistor and the gain control line 74.

The reference voltage $V_{ref11}$ is applied from the reference voltage applying terminal 76 to the source of the field effective transistor which forms the variable resistor 61. The reference voltage $V_{ref12}$ is applied from the reference voltage applying terminal 77 to the gate of the field effective transistor which forms the variable resistor 62 via the resistor The reference voltage $V_{ref13}$ is applied from the reference voltage applying terminal 78 to the gate of the field effective transistor which forms the variable resistor 63 via the resistor. The reference voltage $V_{ref14}$ is applied from the reference voltage applying terminal 79 to the source of the field effective transistor which forms the variable resistor 64.

Figure 8:
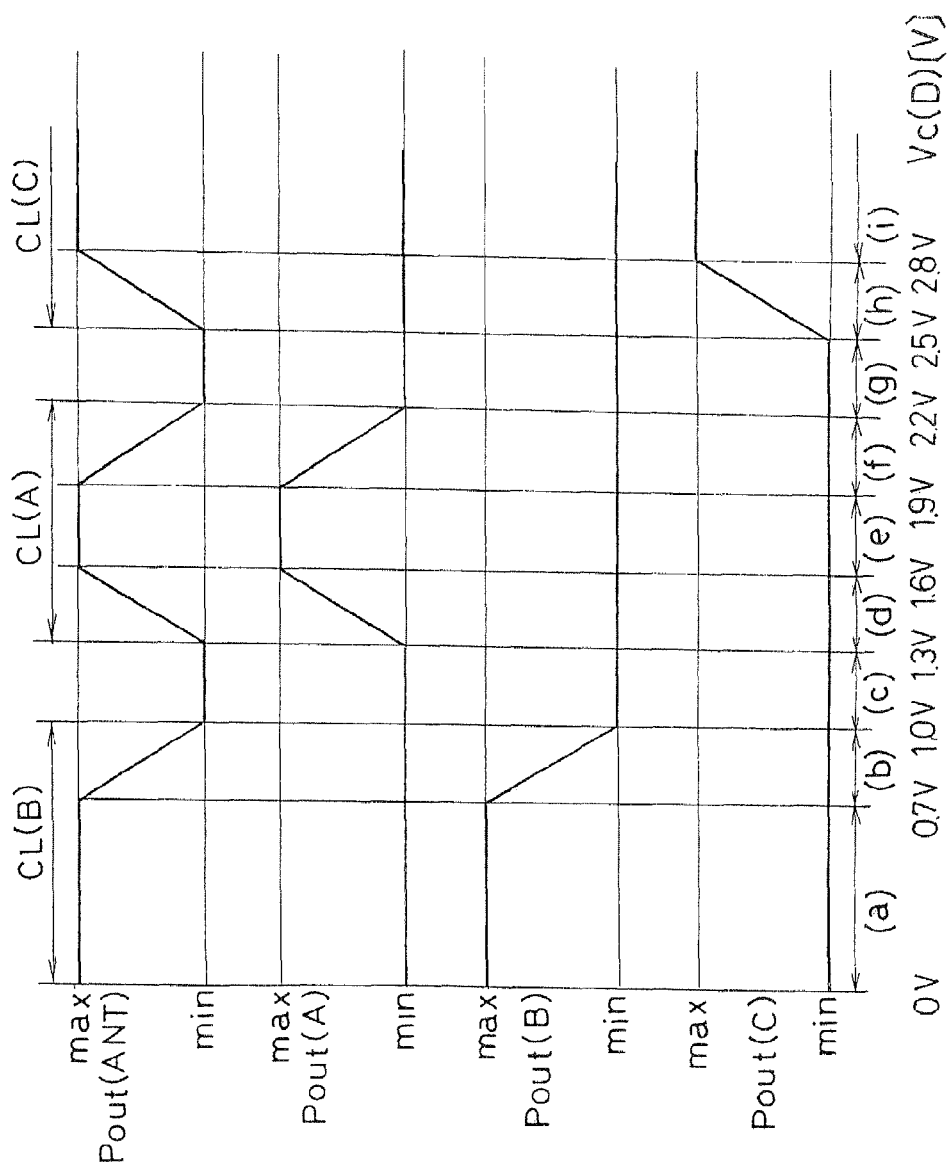
FIG. 8 is a chart which shows switch and gain control characteristics relative to a gain control voltage observed within the attenuator with switch function which is shown in FIG. 7.
Figure 9:
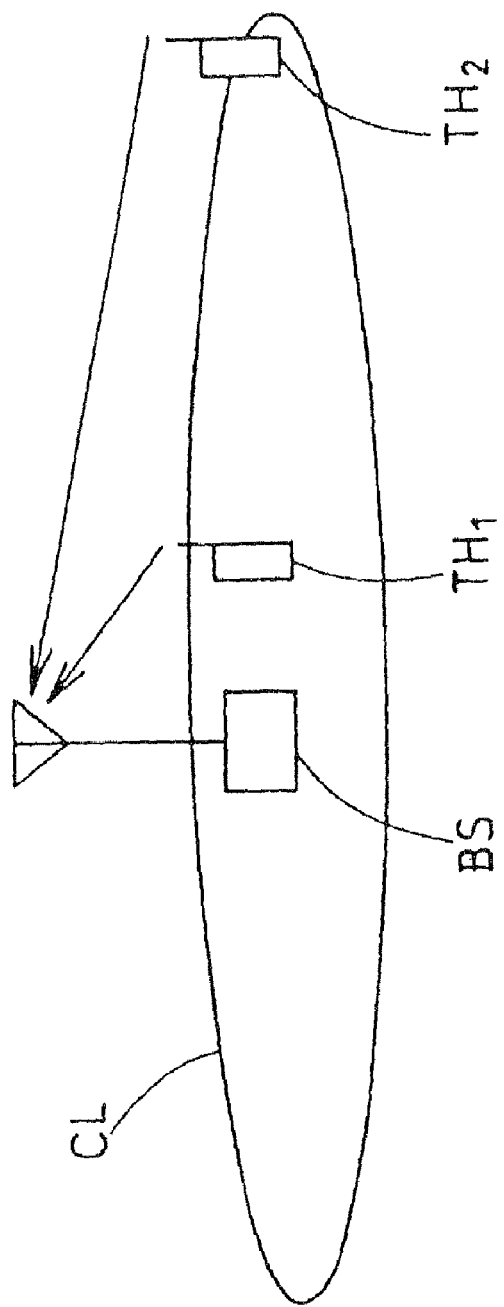
FIG. 9 is a schematic drawing which shows a positional relationship between a base station and a mobile telephone terminal device.
Figure 10:
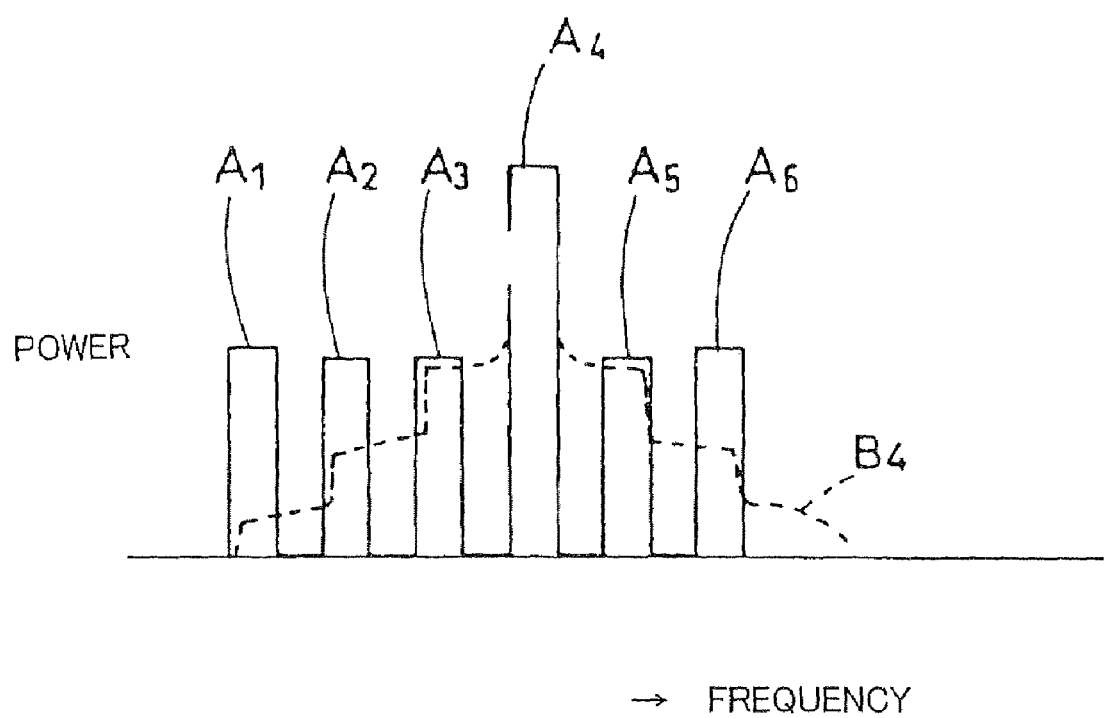
FIG. 10 is an explanatory drawing which shows the intensities of receive signals within the base station on the respective channels.
Figure 11:
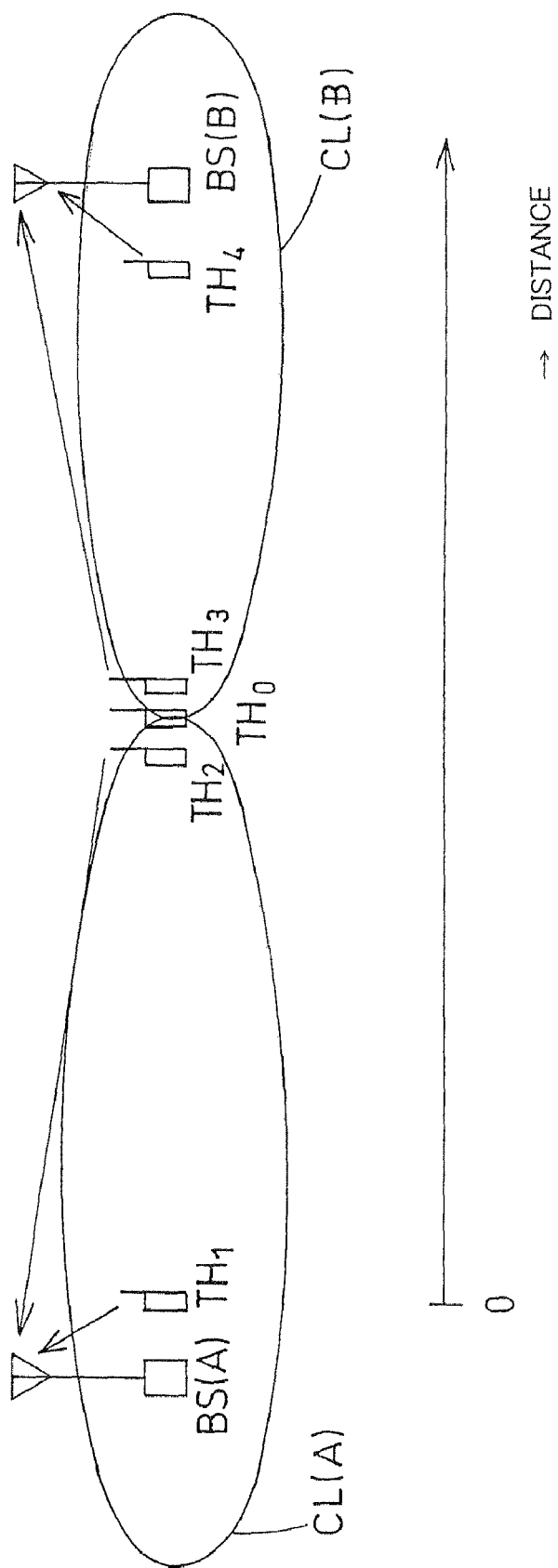
FIG. 11 is a schematic drawing which shows a positional relationship between a base station and a mobile telephone terminal device while the mobile telephone terminal device moves between cells.
Figure 12:
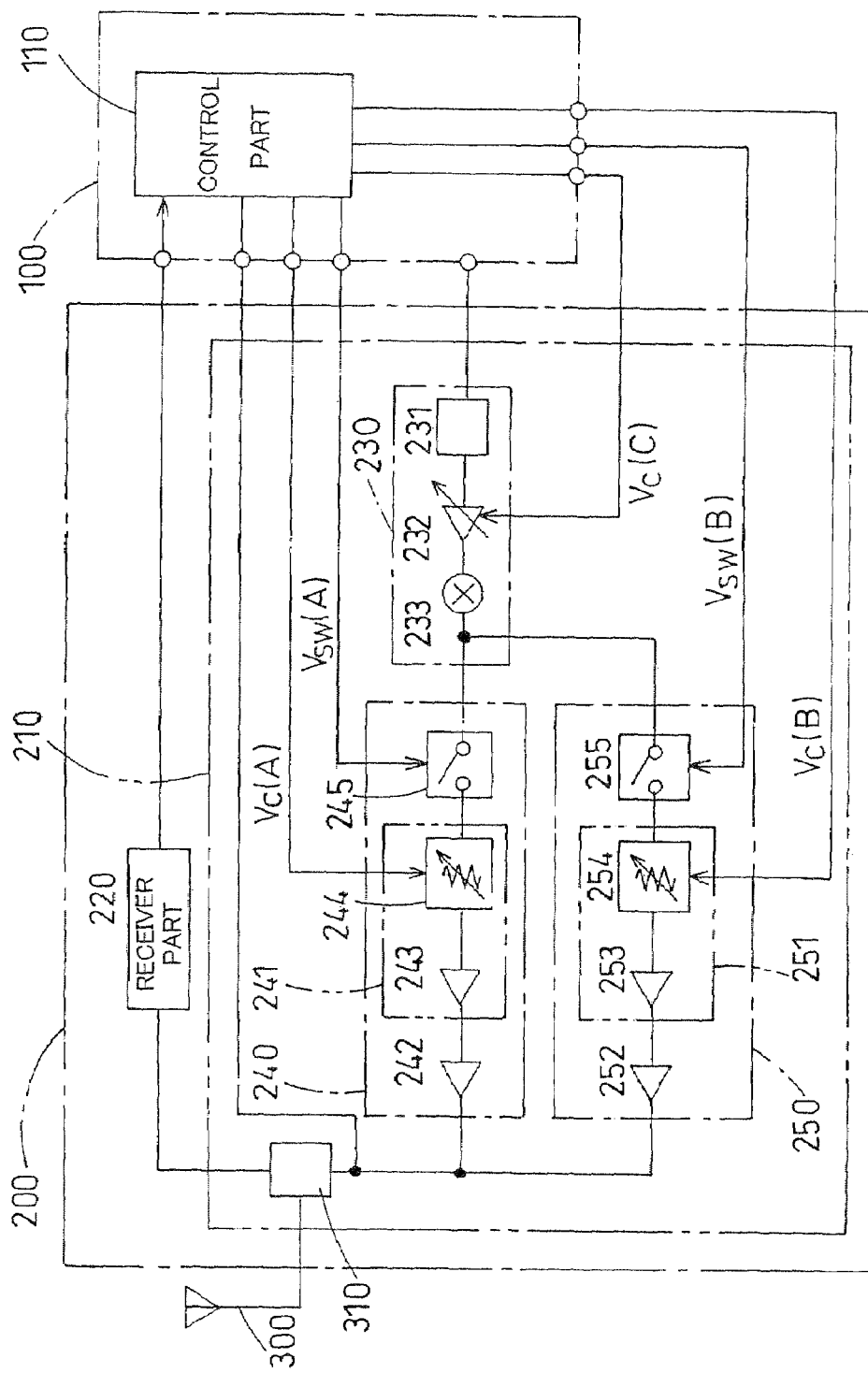
FIG. 12 is a block diagram which shows the structure of a conventional mobile telephone terminal device.
Figure 13:
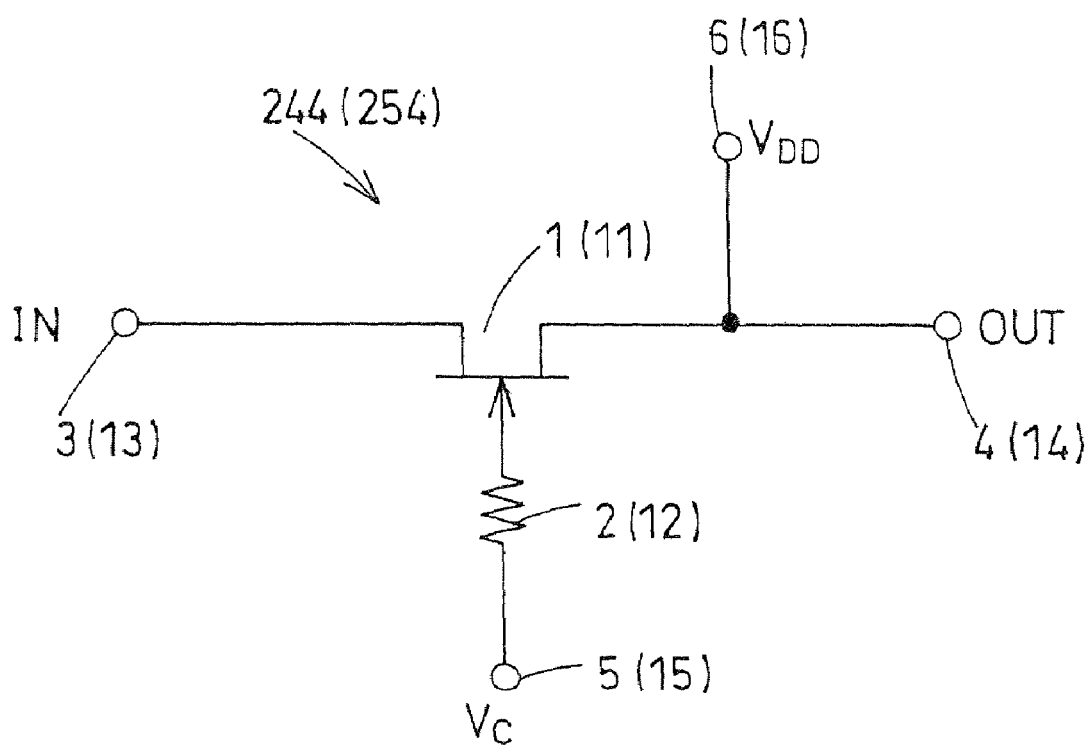
FIG. 13 is a circuitry diagram which shows the structure of attenuators used in the mobile telephone terminal device which is shown in FIG. 12.
Figure 14:
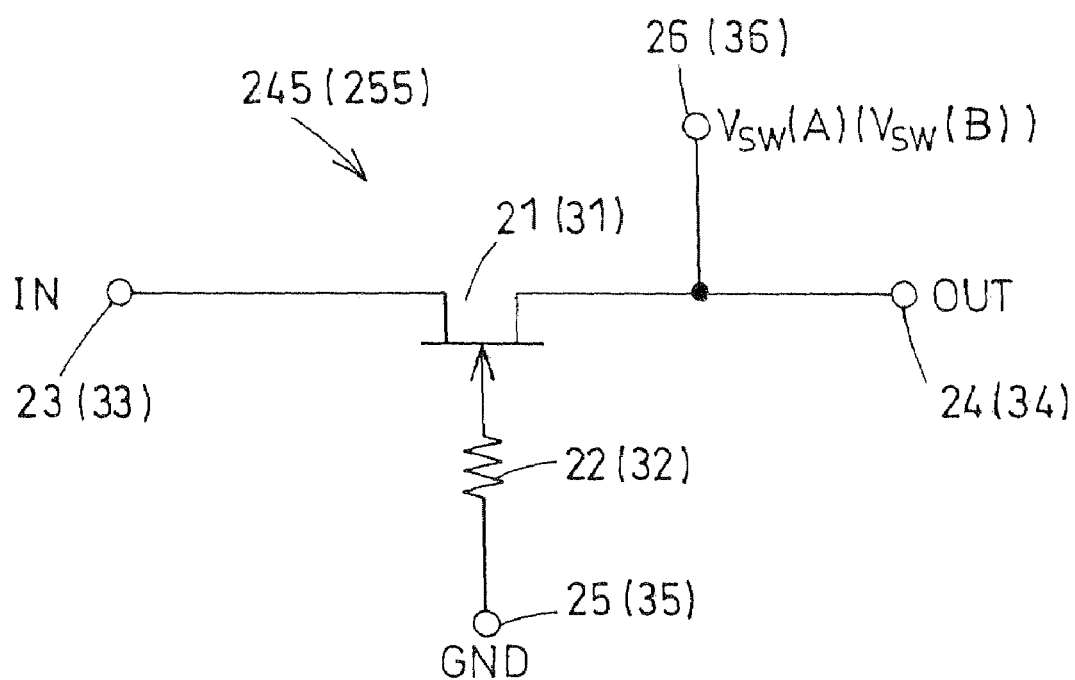
FIG. 14 is a circuitry diagram which shows the structure of switches used in the mobile telephone terminal device which is shown in FIG. 12.
Figure 15:
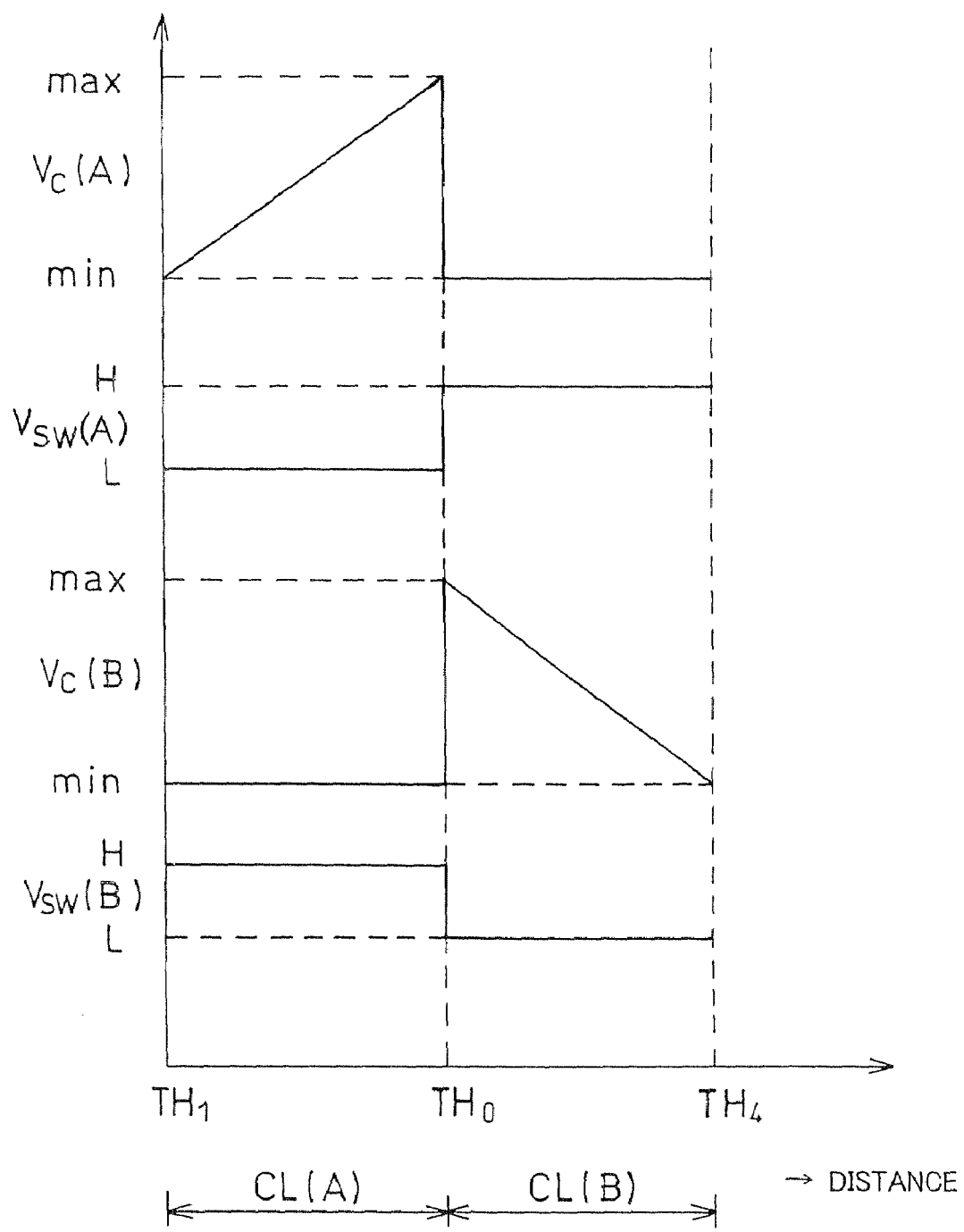
FIG. 15 is a drawing of the set characteristics of the gain control voltage and the switch voltage observed within the attenuators shown in FIG. 13 and the switches shown in FIG. 14 while the mobile telephone terminal device moves between cells.
Figure 16:
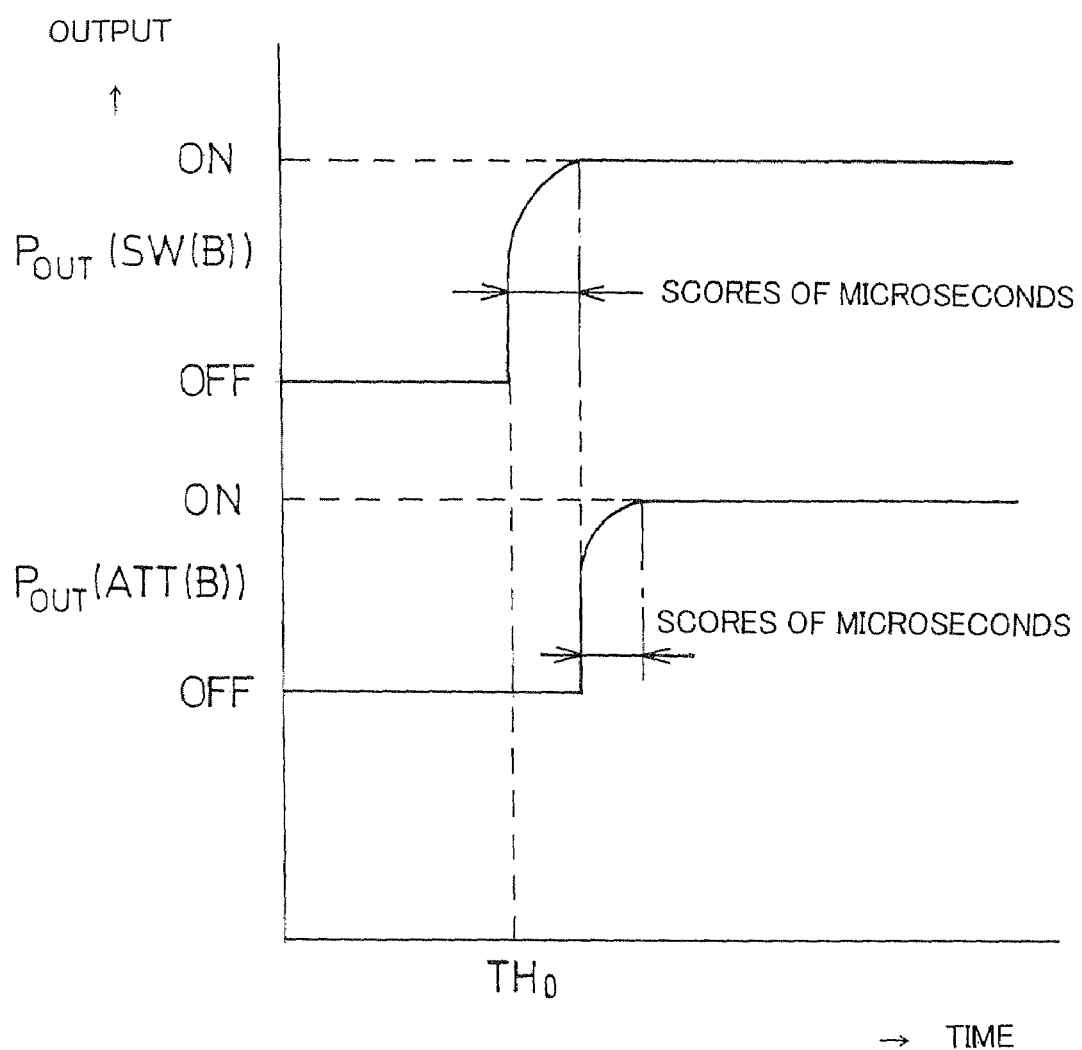
FIG. 16 is a timing chart which shows the timing at which the attenuators shown in FIG. 13 and the switches shown in FIG. 14 operate in response to the switching of the band in accordance with moving between the cells.

FIG. 8 is a gain control characteristics chart which shows a change of the gain (attenuation) in response to the gain control voltage $V_C(D)$ of the attenuator with switch function which is shown in FIG. 7. Operations of the attenuator with switch function shown in FIG. 7 will now be described with reference to FIG. 8.

When the threshold voltage values $V_{th}$ of the field effective transistors are all −0.5 V, the reference voltage $V_{ref11}$ is set to 1.8 V, the reference voltage $V_{ref12}$ is set to 1.7 V, the reference voltage $V_{ref13}$ is set to 0.5 V, and the reference voltage $V_{ref14}$ is set to 3.0 V.

In the event that a voltage of 0 through 0.7 V is applied to the gain control voltage applying terminal 75 (FIG. 8: the gain control voltage range (a)), the resistance values $R_{ON}$ of the variable resistors 61 and 64 reach the maximum value and the resistance values $R_{ON}$ of the variable resistors 62 and 63 reach the minimum value. Hence, on a signal received at the input terminals 65, 66 and 67, the level $P_{OUT}(A)$ of the output signal at the output terminal 68 becomes minimum, the level $P_{OUT}(B)$ of the output signal at the output terminal 69 becomes maximum, and the level $P_{OUT}(C)$ of the output signal at the output terminal 70 becomes minimum. This is a state in which the band (B) is selected but the bands (A) and (C) are not selected.

In the event that a voltage exceeding 0.7 V is applied to the gain control voltage applying terminal 75 (FIG. 8: the gain control voltage range (b)), the resistance values $R_{ON}$ of the variable resistors 61 and 64 reach the maximum value, the resistance value $R_{ON}$ of the variable resistor 62 remains at the minimum value, and the resistance value $R_{ON}$ of the variable resistor 63 starts increasing. Hence, while the level $P_{OUT}(A)$ of the output signal at the output terminal 68 remains minimum, the level $P_{OUT}(C)$ of the output signal at the output terminal 70 remains minimum, and the level $P_{OUT}(B)$ of the output signal at the output terminal 69 decreases. The gain control voltage range in which a variable resistor formed by a field effective transistor performs a linear gain control operation would normally be from about 0.2 to about 0.3 V, and therefore, until application of a voltage of 1.0 V to the gain control voltage applying terminal 75, the gain would decrease about 20 dB linearly. This is a state in which the bands (A) and (C) are not selected and the gain is controlled in the band (B) with the band (B) kept selected.

With application of a voltage of 1.0 V to the gain control voltage applying terminal 75 (FIG. 8: the gain control voltage range (c)), the resistance value $R_{ON}$ of the variable resistor 63 which used to increase reaches maximum, while the resistance value $R_{ON}$ of the variable resistor 62 remains minimum and the resistance values $R_{ON}$ of the variable resistors 61 and 64 stay maximum. Hence, the level $P_{OUT}(B)$ of the output signal at the output terminal 69, the level $P_{OUT}(A)$ of the output signal at the output terminal 68 and the level $P_{OUT}(C)$ of the output signal at the output terminal 70 each become minimum. This is a state in which the bands (A) and (C) are non-selected and the band (B) switches from selected to non-selected.

With application of a voltage of 1.3 V to the gain control voltage applying terminal 75 (FIG. 8: the gain control voltage range (d)), the resistance values $R_{ON}$ of the variable resistors 63 and 64 remain maximum, the resistance value $R_{ON}$ of the variable resistor 62 remains minimum and the resistance value $R_{ON}$ of the variable resistor 61 which used to be maximum starts decreasing. Hence, while the levels $P_{OUT}(B)$ and $P_{OUT}(C)$ of the output signals at the output terminals 69 and 70 remain at the minimum value, the level $P_{OUT}(A)$ of the output signal at the output terminal 68 starts increasing. This is a state in which the band (A) switches from non-selected to selected, gain control is started in the band (A), and the bands (B) and (C) are not selected.

Until application of a voltage of 1.6 V to the gain control voltage applying terminal 75, the level $P_{OUT}$(A) of the output signal at the output terminal 68 increases about 20 dB linearly. During this, the resistance values $R_{ON}$ of the variable resistors 63 and 64 remain at maximum, and the levels $P_{OUT}$(B) and $P_{OUT}$(C) of the output signals at the output terminals 69 and 70 remain at the minimum value.

With application of a voltage of 1.6 V to the gain control voltage applying terminal 75 (FIG. 8: the gain control voltage range (e)), the resistance values $R_{ON}$ of the variable resistors 63 and 64 reach maximum, the resistance value $R_{ON}$ of the variable resistor 62 remains minimum and the resistance value $R_{ON}$ of the variable resistor 61 which used to decrease reaches the minimum value. Hence, the levels $P_{OUT}$(B) and $P_{OUT}$(C) of the output signals at the output terminals 69 and 70 remain at the minimum value, and the level $P_{OUT}$(A) of the output signal at the output terminal 68 becomes maximum. This is a state in which the band (A) is selected, the gain is controlled in the band (A), and the bands (B) and (C) are not selected.

With application of a voltage beyond 1.9 V to the gain control voltage applying terminal 75 (FIG. 8: the gain control voltage range (f)), the resistance values $R_{ON}$ of the variable resistors 63 and 64 reach maximum, the resistance value $R_{ON}$ of the variable resistor 61 remains minimum, but the resistance value $R_{ON}$ of the variable resistor 62 starts increasing. Hence, while the levels $P_{OUT}$(B) and $P_{OUT}$(C) of the output signals at the output terminals 69 and 70 remain minimum, the level $P_{OUT}$(A) of the output signal at the output terminal 68 decreases. Until application of a voltage of 2.2 V to the gain control voltage applying terminal 75, the gain decreases about 20 dB linearly. This is a state in which the bands (B) and (C) are not selected and the gain is controlled in the band (A) with the band (A) kept selected.

With application of a voltage of 2.2 V to the gain control voltage applying terminal 75 (FIG. 8: the gain control voltage range (g)), the resistance value $R_{ON}$ of the variable resistor 62 which used to increase reaches the maximum value, the resistance values $R_{ON}$ of the variable resistors 63 and 64 become maximum, and the resistance value $R_{ON}$ of the variable resistor 61 remains minimum. Hence, the level $P_{OUT}$(A) of the output signal at the output terminal 68, the level $P_{OUT}$(B) of the output signal at the output terminal 69 and the level $P_{OUT}$(C) of the output signal at the output terminal 70 each become minimum. This is a state in which the bands (B) and (C) are not selected and the band (A) switches from selected to non-selected.

With application of a voltage of 2.5 V to the gain control voltage applying terminal 75 (FIG. 8: the gain control voltage range (h)), the resistance values $R_{ON}$ of the variable resistors 62 and 63 reach maximum, the resistance value $R_{ON}$ of the variable resistor 61 remains minimum, and the resistance value $R_{ON}$ of the variable resistor 64 which used to be maximum starts decreasing. Hence, while the levels $P_{OUT}$(A) and $P_{OUT}$(B) of the output signals at the output terminals 68 and 69 remain at the minimum value, the level $P_{OUT}$(C) of the output signal at the output terminal 70 starts increasing. This is a state in which the band (C) switches from non-selected to selected, gain control is started in the band (C), and the bands (A) and (B) are not selected.

Until application of a voltage of 2.8 V to the gain control voltage applying terminal 75, the level $P_{OUT}$(C) of the output signal at the output terminal 70 increases about 20 dB linearly. During this, the resistance values $R_{ON}$ of the variable resistors 62 and 63 remain at maximum, the resistance value $R_{ON}$ of the variable resistor 61 remains minimum, and the levels $P_{OUT}$(A) and $P_{OUT}$(B) of the output signals at the output terminals 68 and 69 remain at the minimum value.

With application of a voltage of 2.8 V to the gain control voltage applying terminal 75 (FIG. 8: the gain control voltage range (i)), the resistance values $R_{ON}$ of the variable resistors 62 and 63 reach maximum, the resistance value $R_{ON}$ of the variable resistor 61 remains minimum, and the resistance value $R_{ON}$ of the variable resistor 64 which used to decrease becomes minimum. Hence, while the levels $P_{OUT}$(A) and $P_{OUT}$(B) of the output signals at the output terminals 68 and 69 remain at the minimum value, the level $P_{OUT}$(C) of the output signal at the output terminal 70 reaches maximum. This is a state in which the band (C) is selected, the gain is controlled in the band (C), and the bands (A) and (B) are not selected.

Even with application of a voltage of 2.8 V or higher to the gain control voltage applying terminal 75, the resistance values $R_{ON}$ of the variable resistors 61 and 64 stay minimum and the resistance values $R_{ON}$ of the variable resistors 62 and 63 stay maximum. Hence, while the levels $P_{OUT}$(A) and $P_{OUT}$(B) of the output signals at the output terminals 68 and 69 remain minimum, the level $P_{OUT}$(C) of the output signal at the output terminal 70 remains maximum.

A mobile telephone terminal device which uses the attenuator with switch function described above is of the type which switches over three bands.

Further, nothing is connected in parallel between the drain and the source electrodes of the field effective transistors 53 and 55 which form the respective variable resistors 41 and 42 in the preferred embodiment described above. However, for the purpose of suppressing variations of the resistance values unique to the respective field effective transistors 53 and 55 and controlling the variable resistance ranges, resistors or the like may be connected parallel between the drain and the source electrodes of the field effective transistors 53 and 55. This stabilizes the amount of gain control at each variable resistor and realizes gain control at an extremely high accuracy.

Further, although the preferred embodiment described above demands that a field effective transistor having one gate is used as each one of the field effective transistors 53 and 55 which respectively form the respective variable resistors 41 and 42, a field effective transistor having two or more gates (of the multiple-gate type) may be used instead. The more gates a field effective transistor has, the wider the gain control width becomes, and in addition, even use of a high input signal achieves switch control and gain control accompanying only a suppressed deterioration of distortion characteristics. Further, while the foregoing has described that one field effective transistor is used for each one of the variable resistors 41 and 42, each variable resistor may be formed by a series circuit of two or more field effective transistors.

Further, while the preferred embodiment described above is directed to an example that the field effective transistors 53 and 55 are used to respectively form the variable resistors 41 and 42, the present invention is not limited to this. Elements such as diodes may be used for instance.

These attenuators can be used not only for the PDC method but for various mobile telecommunications methods (CDMA (IS-95), GSM, PCS, DCS, Wideband-CDMA, CDMA2000, PHS, etc.).

The invention claimed is:

1. A mobile telephone terminal device, characterized in using, for the purpose of switching of a selected band between two bands and for the purpose of gain control in the selected band, an attenuator with switch function which comprises: a first variable resistor (41) inserted in a first signal line (47) which connects a first signal input part (43) with a first signal output part (45); and a second variable resistor (42) inserted in a second signal line (48) which connects a second signal input part (44) with a second signal output part (46), said attenuator being characterized in that as the attenuation of each one of said first and said second variable resistors (41) and (42) is controlled by means of a gain control voltage, either one of outputs on said first and said second signal lines (47) and (48) is blocked and the gain of the remaining output on said first and said second signal lines (47) and (48) is controlled linearly and continuously.

2. A mobile telephone terminal device, characterized in using, for the purpose of switching of a selected band between two bands and for the purpose of gain control in the selected band, an attenuator with switch function which comprises: a first variable resistor (41) inserted in a first signal line (47) which connects a first signal input part (43) with a first signal output part (45); a second variable resistor (42) inserted in a second signal line (48) which connects a second signal input part (44) with a second signal output part (46); a first and a second reference voltage applying parts (51) and (52) which are connected respectively with said first and said second variable resistors (41) and (42); and a gain control voltage applying part (50) which is connected with each one of said first and said second variable resistors (41) and (42) via a common gain control line (49).

3. The mobile telephone terminal device of claim 2, wherein said first variable resistor (41) has a structure that a first resistor (54) is connected at least with the gate of a first field effective transistor (53), said second variable resistor (42) has a structure that a second resistor (56) is connected at least with the gate of a second field effective transistor (55), the gate of said first field effective transistor (53) is connected with said gain control voltage applying part (50) via said first resistor (54) and said gain control line (49), the source of said second field effective transistor (55) is connected with said gain control voltage applying part (50) via said gain control line (49), the source of said first field effective transistor (53) is connected with said first reference voltage applying part (51), and the gate of said second field effective transistor (55) is connected with said second reference voltage applying part (52) via said second resistor (56).

4. The mobile telephone terminal device of claim 3, wherein a voltage applied to said second reference voltage applying part (52) is lower, by a value which is calculated by subtracting a difference between gain control voltages which completely turn off said first and said second field effective transistors (53) and (55) from the sum of the threshold voltage of said first field effective transistor (53) and the threshold voltage of said second field effective transistor (55), than a voltage applied to said first reference voltage applying part (51).

5. The mobile telephone terminal device of claim 3, wherein the values of voltages applied to said first and said second reference voltage applying parts (51) and (52) are set such that a gain control voltage which completely turns off said second field effective transistor (55) will be lower than a gain control voltage which completely turns off said first field effective transistor (53).

6. The mobile telephone terminal device of claim 3, wherein the values of voltages applied to said first and said second reference voltage applying parts (51) and (52) are set such that only when one of said first and said second field effective transistors (53) and (55) is completely off, the other one of said first and said second field effective transistors (53) and (55) will perform a gain control operation.

7. The mobile telephone terminal device of claim 2, wherein a voltage applied to said second reference voltage applying part (52) is lower than a voltage applied to said first reference voltage applying part (51).

8. The mobile telephone terminal device of claim 2, wherein the values of voltages applied to said first and said second reference voltage applying parts (51) and (52) are set such that the gain control voltage range over which said first variable resistor (41) performs a gain control operation will not overlap with the gain control voltage range over which said second variable resistor (42) performs a gain control operation.

9. The mobile telephone terminal device of claim 2, wherein the values of voltages applied to said first and said second reference voltage applying parts (51) and (52) are set such that the gain control voltage range over which said second variable resistor (42) performs a gain control operation will be lower than the gain control voltage range over which said first variable resistor (41) performs a gain control operation.

10. The mobile telephone terminal device of claim 2, wherein said first variable resistor (41) has a structure that a first resistor (54) is connected at least with the gate of a first field effective transistor (53); said second variable resistor (42) has a structure that a second resistor (56) is connected at least with the gate of a second field effective transistor (55); the gate of said first field effective transistor (53) is connected with said gain control voltage applying part (50) via said first resistor (54) and said gain control line (49); the source of said second field effective transistor (55) is connected with said gain control voltage applying part (50) via said gain control line (49); a third resistor (57) is inserted between the source of said first field effective transistor (53) and a portion (60) which is connected with the gate of said second field effective transistor (55) via said second resistor (56); a fourth resistor (58) is inserted between said portion (60), which is connected with the gate of said second field effective transistor (55) via said second resistor (56), and a basic potential portion (59); and the source of said first field effective transistor (53) is connected with said first reference voltage applying part (51).

11. A mobile telephone terminal device, characterized in using, for the purpose of switching of a selected band among at least three bands or more and for the purpose of gain control in the selected band, an attenuator with switch function which comprises: a series circuit of a first and a second variable resistors (61) and (62) which are inserted in at least one first signal line (71) which connects a first signal input part (65) with a first signal output part (68); and a third variable resistor (63) inserted in a second signal line (72) which connects a second signal input part (66) with a second signal output part (69); a fourth variable resistor (64) inserted in a third signal line (73) which connects a third signal input part (67) with a third signal output part (70), said attenuator being characterized in that as the attenuation of each one of said first, said second, said third and said fourth variable resistors (61), (62), (63) and (64) is controlled by means of a gain control voltage, the gain of either one of outputs on said first, said second and said third signal lines (71), (72) and (73) is controlled linearly and continuously and the remaining ones of said first, said second and said third signal lines (71), (72) and (73) are blocked.

12. A mobile telephone terminal device, characterized in using, for the purpose of switching of a selected band among at least three bands or more and for the purpose of gain control in the selected band, an attenuator with switch function which comprises: a series circuit of a first and a second variable resistors (61) and (62) which are inserted in at least one first signal line (71) which connects a first signal input part (65) with a first signal output part (68); a third variable resistor (63) inserted in a second signal line (72) which connects a second signal input part (66) with a second signal output part (69); a fourth variable resistor (64) inserted in a third signal line (73) which connects a third signal input part (67) with a third signal output part (70); and a first, a second, a third and a fourth reference voltage applying parts (76), (77), (78) and (79) which are connected respectively with said first, said second, said third and said fourth variable resistors (61), (62), (63) and (64); and a gain control voltage applying part (75) which is connected with each one of said first, said second, said third and said fourth variable resistors (61), (62), (63) and (64) via a common gain control line (74).

13. A mobile telephone terminal device, characterized in comprising: a baseband part (101), which processes a speech signal and a radio part (201), which receives the speech signal processed by said baseband part (101) and communicates with a base station; said radio part (201) is comprised of a sender part (260) which generates a send signal to said base station and a receiver part (220) which receives the send signal from said base station; said sender part (260) is comprised of an intermediate frequency part (230), which is formed by a modulator (231) which modulates an intermediate frequency signal in accordance with the speech signal which is provided from said baseband part (101), a variable gain intermediate frequency amplifier (232) which controls the gain of said intermediate frequency signal and a mixer (233) which performs mixing for frequency conversion from said intermediate frequency signal into a high frequency signal, and a high frequency part (270) which amplifies said high frequency signal outputted from said intermediate frequency part (230) and supplies to an antenna (300); said high frequency part (270) is comprised of a gain controller with switch function (271), which switches a selected band between two bands outputted from said intermediate frequency part (230) and controls the gain of said high frequency signal in the selected band, and two power amplifiers (242) and (252) which respectively power-amplify two outputs from said gain controller with switch function (271); said gain controller with switch function (271) includes an attenuator with switch function (272) which switches a selected band between two bands outputted from said intermediate frequency part (230) and controls the gain of said high frequency signal in the selected band, said mobile telephone terminal device being characterized in that said baseband part (101) includes a control part (120); said control part (120) detects signal information about a receive signal received by said receiver part (220) and adds a gain control voltage corresponding to this information to said attenuator with switch function (272) so that an output from either one (242) of said two power amplifiers is taken over by an output from the other one (252) of said two power amplifiers; a target value for the output level of the other one (252) of said two power amplifiers is then set in accordance with the signal information about said receive signal; the output level of the other one (252) of said two power amplifiers is compared with the target value for the output level of the other one (252) of said two power amplifiers; a gain control voltage corresponding to the result of the comparison is added to said attenuator with switch function (272) and said variable gain intermediate frequency amplifier (232), thereby follow-up controlling the gains of said attenuator with switch function (272) and said variable gain intermediate frequency amplifier (232) such that the output level of the other one (252) of said two power amplifiers will become equal to the target value for the output level of the other one (252) of said two power amplifiers, and that said attenuator with switch function (272) is comprised of a first variable resistor (41), which is inserted in a first signal line (47) which connects a first signal input part (43) for said high frequency signal with a first signal output part (45) and for said high frequency signal; and a second variable resistor (42) which is inserted in a second signal line (48) which connects a second signal input part (44) for said high frequency signal with a second signal output part (46) for said high frequency signal; the attenuation of each one of said first and said second variable resistors (41) and (42) is controlled using a gain control voltage, thereby blocking either one of outputs on said first and said second signal lines (47) and (48) while linearly and continuously controlling the remaining one of the outputs on said first and said second signal lines (47) and (48); and said attenuator with switch function (272) accordingly switches to the output from said power amplifier (252) from the output from said power amplifier (242) while linearly and continuously controlling the gain of the output from said power amplifier (252).

14. A mobile telephone terminal device, characterized in comprising: a baseband part (101), which processes a speech signal and a radio part (201), which receives the speech signal processed by said baseband part (101) and communicates with a base station; said radio part (201) is comprised of a sender part (260) which generates a send signal to said base station and a receiver part (220) which receives the send signal from said base station; said sender part (260) is comprised of an intermediate frequency part (230), which is formed by a modulator (231) which modulates an intermediate frequency signal in accordance with the speech signal which is provided from said baseband part (101), a variable gain intermediate frequency amplifier (232) which controls the gain of said intermediate frequency signal and a mixer (233) which performs mixing for frequency conversion from said intermediate frequency signal into a high frequency signal, and a high frequency part (270) which amplifies said high frequency signal outputted from said intermediate frequency part (230) and supplies to an antenna (300); said high frequency part (270) is comprised of a gain controller with switch function (271), which switches a selected band between two bands outputted from said intermediate frequency part (230) and controls the gain of said high frequency signal in the selected band, and two power amplifiers (242) and (252) which respectively power-amplify two outputs from said gain controller with switch function (271); said gain controller with switch function (271) includes an attenuator with switch function (272) which switches a selected band between two bands outputted from said intermediate frequency-part (230) and controls the gain of said high frequency signal in the selected band, said mobile telephone terminal device being characterized in that said baseband part (101) includes a control part (120); said control part (120) detects signal information about a receive signal received by said receiver part (220) and adds a gain control voltage corresponding to this information to said attenuator with switch function (272) so that an output from either one (242) of said two power amplifiers is taken over by an output from the other one (252) of said two power amplifiers; a target value for the output level of the other one (252) of said two power amplifiers is then set in accordance with the signal information about said receive signal; the output level of the other one (252) of said two power amplifiers is compared with the target value for the output level of the other one (252) of said two power amplifiers; a gain control voltage corresponding to the result of the comparison is added to said attenuator with switch function (272) and said variable gain intermediate frequency amplifier (232), thereby follow-up controlling the gains of said attenuator with switch function (272) and said variable gain intermediate frequency amplifier (232) such that the output level of the other one (252) of said two power amplifiers will become equal to the target value for the output level of the other one (252) of said two power amplifiers, and that said attenuator with switch function (272) is comprised of: a first variable resistor (41) which is inserted in a first signal line (47) which connects a first signal input part (43) for said high frequency signal with a first signal output part (45) and for said high frequency signal; a second variable resistor (42) which is inserted in a second signal line (48) which connects a second signal input part (44) for said high frequency signal with a second signal output part (46) for said high frequency signal; a first and a second reference voltage applying parts (51) and (52) which are connected respectively with said first and said second variable resistors (41) and (42); and a gain control voltage applying part (50) which is connected with each one of said first and said second variable resistors (41) and (42) via a common gain control line (49).

* * * * *